US009020857B2

(12) United States Patent
Mun

(10) Patent No.: US 9,020,857 B2
(45) Date of Patent: Apr. 28, 2015

(54) INTEGRATED RISK MANAGEMENT PROCESS

(76) Inventor: Johnathan C. Mun, Pleasanton, CA (US)

(*) Notice: Subject to any disclaimer, the term of this patent is extended or adjusted under 35 U.S.C. 154(b) by 1176 days.

(21) Appl. No.: 12/378,169

(22) Filed: Feb. 11, 2009

(65) Prior Publication Data

US 2010/0205042 A1 Aug. 12, 2010

(51) Int. Cl.
*G06Q 99/00* (2006.01)
*G06Q 10/06* (2012.01)
*G06Q 10/04* (2012.01)
*G06Q 30/02* (2012.01)

(52) U.S. Cl.
CPC .......... *G06Q 10/06* (2013.01); *G06Q 10/0633* (2013.01); *G06Q 10/04* (2013.01); *G06Q 30/0202* (2013.01); *G06Q 2220/18* (2013.01)

(58) Field of Classification Search
CPC .............. G06Q 10/0633; G06Q 10/04; G06Q 30/0202; G06Q 2220/18
USPC .......................... 705/7.28, 7.11, 7.31, 59, 348
See application file for complete search history.

(56) References Cited

U.S. PATENT DOCUMENTS

| 7,313,531 | B2* | 12/2007 | Chappel et al. ............. 705/7.17 |
|---|---|---|---|
| 7,415,453 | B2* | 8/2008 | Suzuki et al. .......................... 1/1 |
| 7,664,671 | B2* | 2/2010 | Shan ............................ 705/7.11 |
| 7,742,940 | B1* | 6/2010 | Shan et al. .................... 705/7.31 |
| 7,742,972 | B2* | 6/2010 | Lange et al. .................... 705/37 |
| 7,797,184 | B2* | 9/2010 | Shan et al. .................... 705/7.31 |
| 7,836,111 | B1* | 11/2010 | Shan ............................ 708/200 |
| 2004/0111358 | A1* | 6/2004 | Lange et al. .................... 705/37 |
| 2004/0158536 | A1* | 8/2004 | Kowal et al. .................. 705/400 |
| 2006/0010101 | A1* | 1/2006 | Suzuki et al. ..................... 707/2 |
| 2006/0074817 | A1* | 4/2006 | Shan et al. .................... 705/400 |
| 2006/0116921 | A1* | 6/2006 | Shan ............................. 705/10 |

* cited by examiner

*Primary Examiner* — James D Nigh
(74) *Attorney, Agent, or Firm* — James M. Smedley LLC; James Michael Smedley, Esq.

(57) ABSTRACT

A method and system allowing the analysis of risk through the use of Monte Carlo simulation, statistical and data analysis, stochastic forecasting, and optimization. The present invention includes novel methods such as the detailed reporting capabilities coupled with advanced analytical techniques, an integrated risk management process and procedures, adaptive licensing technology, and model profiling and storage procedures.

2 Claims, 13 Drawing Sheets

FIGURE 4

CHANGE ACTIVE SIMULATION

| Simulation Name | File Name |
|---|---|
| Profile 1 | Book 1 |
| Profile 2 | Book 2 |
| Profile 3 | Book 3 |
| Profile 4 | Book 4 |

[Delete] [Duplicate]   [OK] [Cancel]

4 → Profile 1

FIGURE 8

| AUTO ARIMA | | | | |
|---|---|---|---|---|
| Time Series Variable | | | | |
| Exogenous Variable | | | | |
| Maximum Iterations | 1000 | | | |
| Forecast Periods | 50 | | Run | |
| ☐ Backcast | | | | |
| Results | | | | |
| | Adjusted R-Squared | Akaike Information Criterion (AIC) | Schwarz Criterion (SC) | Durbin-Watson Statistic (DW) | Number of Iterations |
| P=2, D=0, Q=0 | 0.9999 | 4.4740 | 4.5440 | 2.0299 | 0 |
| P=1, D=0, Q=1 | 0.9999 | 4.4750 | 4.5449 | 1.9221 | 20 |
| P=1, D=0, Q=0 | 0.9999 | 4.6852 | 4.7410 | 1.0656 | 0 |
| P=0, D=0, Q=1 | 0.9956 | 8.7959 | 8.8516 | 0.1846 | 29 |
| P=1, D=1, Q=2 | 0.5060 | 4.4843 | 4.5682 | 2.0422 | 28 |
| P=2, D=1, Q=1 | 0.5015 | 4.4845 | 4.5686 | 1.9694 | 61 |
| P=1, D=1, Q=1 | 0.4939 | 4.5109 | 4.5809 | 1.8694 | 30 |
| P=2, D=1, Q=0 | 0.4840 | 4.5212 | 4.5913 | 2.0341 | 0 |
| P=1, D=1, Q=0 | 0.4807 | 4.5390 | 4.5950 | 2.0913 | 0 |

OK   Cancel

| DATA DIAGNOSTIC TOOL | | | | | | |
|---|---|---|---|---|---|---|
| Dependent Variable VAR1 ▼ | | | | | | |
| VAR1 | VAR2 | VAR3 | VAR4 | VAR5 | VAR6 | |
| 521 | 18308 | 185 | 4.041 | 79.6 | 7.2 | |
| 367 | 1148 | 600 | 0.55 | 1 | 8.5 | |
| 443 | 18068 | 372 | 3.665 | 32.3 | 5.7 | |
| 365 | 7729 | 142 | 2.351 | 45.1 | 7.3 | |
| 614 | 100484 | 432 | 26.76 | 190.8 | 7.5 | |
| | | | | OK | Cancel | |

29

INTEGRATED RISK MANAGEMENT PROCESS

COPYRIGHT AND TRADEMARK NOTICE

A portion of the disclosure of this patent document contains materials subject to copyright and trademark protection. The copyright and trademark owner has no objection to the facsimile reproduction by anyone of the patent document or the patent disclosure, as it appears in the U.S. Patent and Trademark Office patent files or records, but otherwise reserves all copyrights whatsoever.

BACKGROUND OF THE INVENTION

The present invention is in the field of finance, economics, math, and business statistics, and relates to the modeling and valuation of risk within all companies, allowing these firms to properly assess, quantify, value, diversify, and hedge their risks.

The field of risk analysis is large and complex, and this invention allows a new and novel set of analytics in a integrated and comprehensive manner, where executive reports with detailed explanations, numerical results and charts are generated within one to three mouse clicks. The invention uses Monte Carlo simulation, stochastic forecasting, business statistics, and optimization techniques in a novel way to analyze a user's existing data set to extract valuable and important information. In addition, the invention includes new and novel computer logic to save modeling parameters and inputs within multiple profiles in a single Excel workbook file, and covers a unique method to license software products through the use of a hardware identification algorithm.

SUMMARY OF THE INVENTION

Risk and uncertainty abound in the business world and impact business decisions and ultimately affects the profitability and survival of the corporation. The present invention's preferred embodiment is encapsulated in the Risk Simulator software, which incorporates a lot of advanced analytical techniques and algorithms and compiles them in such a unique and novel way to facilitate business risk analysis, through an intelligent set of statistical and analytical tests to analyze and extract information that otherwise cannot be obtained manually. That is, instead of requiring the user to understand advanced statistics, financial modeling and mathematics, in order to know what analysis to run on some existing data or the ability to interpret the raw numerical results, this present invention automatically runs the relevant analyses in an integrated fashion, and provides detailed description in its reports, coupled with the numerical results and charts for easy interpretation. The present invention also includes a novel licensing capability that extracts the user's system and hardware information to create a license protection. In addition, an integrated risk management business process method is developed that allows the user to step through the risk analysis methodology step by step in an integrated and comprehensive manner.

Monte Carlo simulation refers to a method where risk and uncertainty is quantified, through the use of mathematical algorithms of randomly sampling numbers from a specific distribution. For instance, suppose we need to forecast the revenues of a product the following year but this value is unknown, but nonetheless, we know from past experience that revenues for these types of products has a mean of X and standard deviation of Y, and follows a normal distribution. Further suppose that there are multiple products sold by this company. We can then take advantage of this fact and randomly select data points thousands of times with replacement, from a set of normal distribution with these specifications. The end result is thousands of forecast results, and using these results, we can determine the company's total revenues and the probability that the revenue will exceed some predefined value, and so forth.

BRIEF DESCRIPTION OF THE DRAWING

FIG. 04 illustrates the simulation profiles.

FIG. 08 illustrates the auto ARIMA module and report.

FIG. 12 illustrates the econometric and regression data diagnostic module.

DETAILED DESCRIPTION OF THE INVENTION

Figure 1:
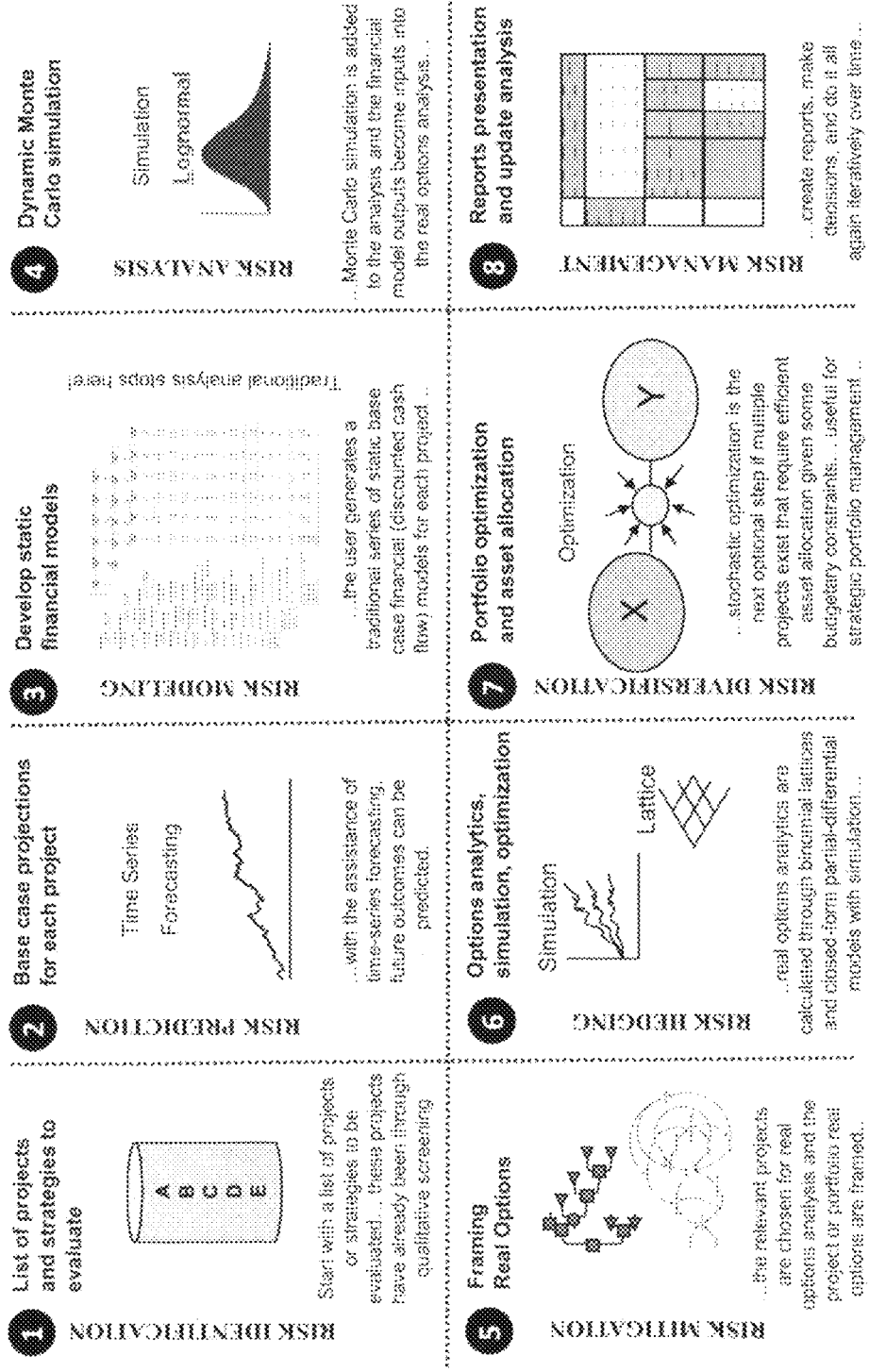
FIG. 01 illustrates the Integrated Risk Management Process steps.

FIG. 01 illustrates the integrated risk management process 1 on the process and method undertaken in the preferred embodiment of the present invention in the Risk Simulator software.

Figure 2:
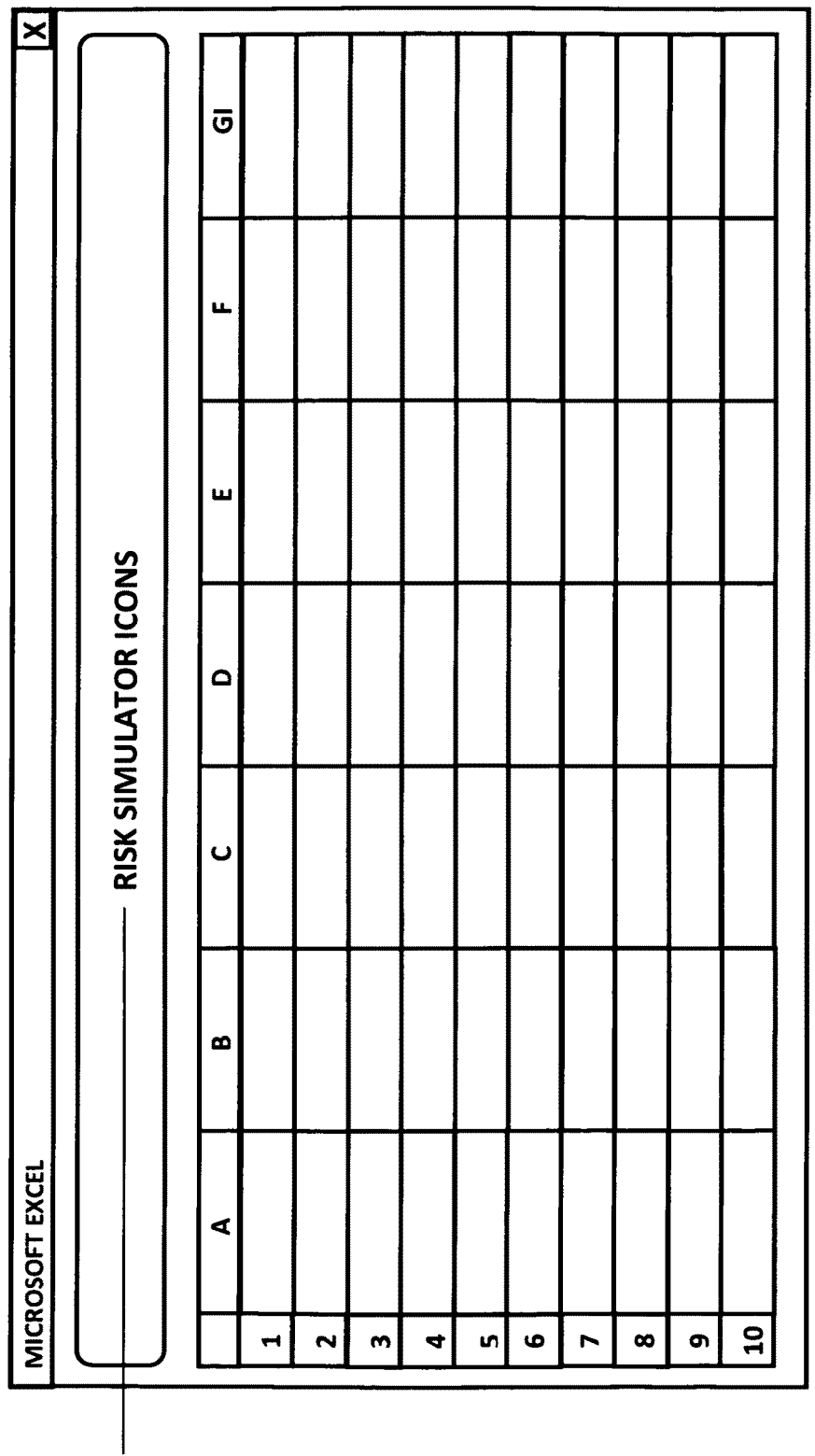
FIG. 02 illustrates the Risk Simulator menu item with integrated language capabilities.

FIG. 02 illustrates the menu items in the software and that several foreign languages 2 exists in the software and can be changed immediately without having to restart the operating system or having to install a different software version. All language packs are available immediately.

Figure 3:
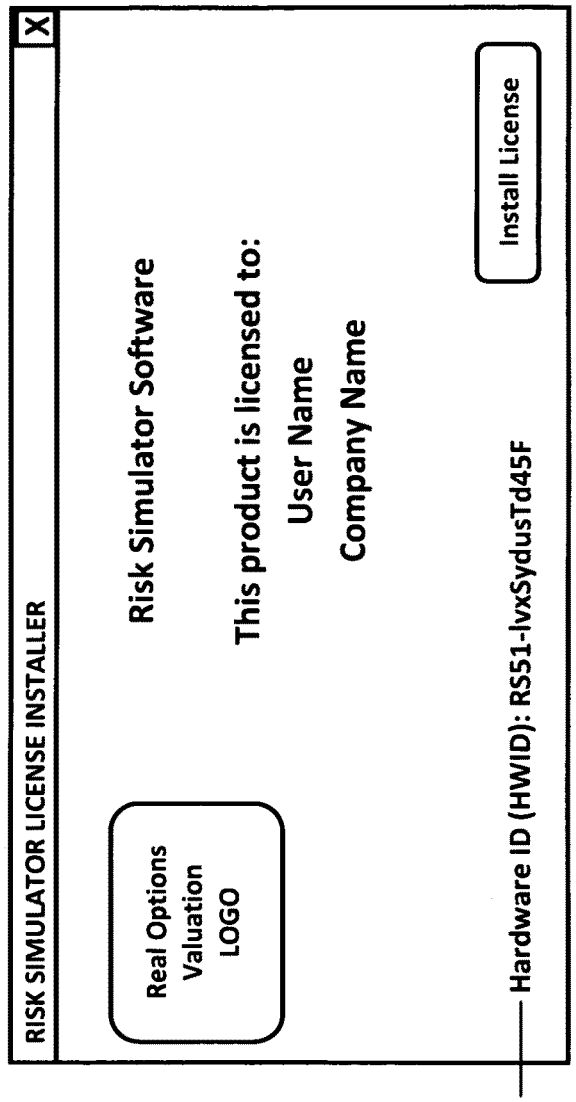
FIG. 03 illustrates the licensing scheme using a computer's unique set of hardware information.

FIG. 03 illustrates the licensing schema. The present invention's method allows the software to access the user computer's hardware and software configurations such as the user name on the computer, serial number on the operating system, serial numbers from various hardware devices such as the hard drive, motherboard, wireless and Ethernet card, take these values and apply some proprietary mathematical algorithms to convert them into a 10 to 20 alphanumerical Hardware ID 3. These Hardware IDs are unique to each computer and no two computers have the same identification. The prefix to this Hardware ID indicates the software type while the last letter on the ID indicates the type of hardware configuration on this computer (e.g., the letter "F" indicates that the hard drive and motherboard are properly installed and these serial numbers are used to generate this ID). Other suffix letters indicate various combinations of serial numbers used.

FIG. 04 illustrates the profile method in the software 4, where instead of creating multiple versions of the same Excel file, a single Excel file can contain multiple profiles that stores all the relevant information and parameters in the model, the system comprising the ability to create, duplicate, delete, and switch among multiple profiles in a single Excel file and the profile is saved as an encrypted XML code in a hidden sheet in the Excel file.

Figure 5:
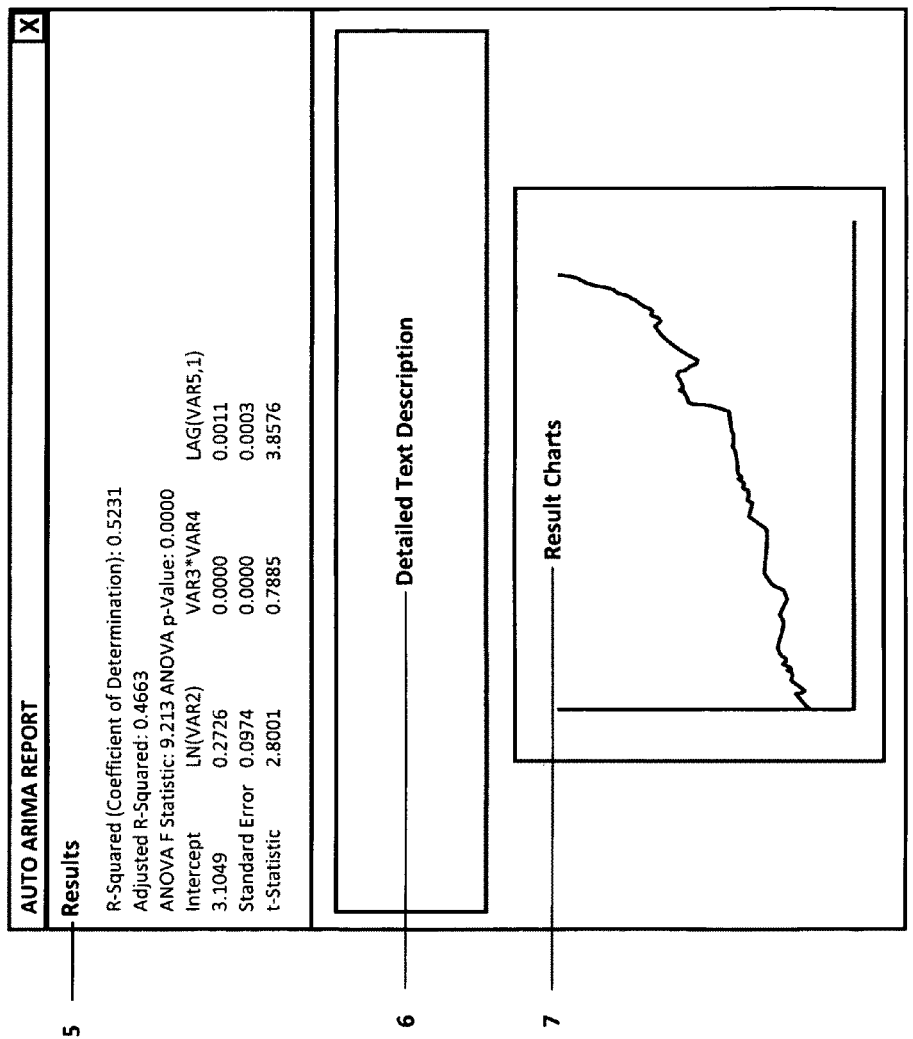
FIG. 05 illustrates a sample report from the integrated system.

FIG. 05 illustrates a sample report generated from the software, complete with numerical results 5, detailed descriptions of the results 6 and executive dashboards and charts 7.

Figure 6:
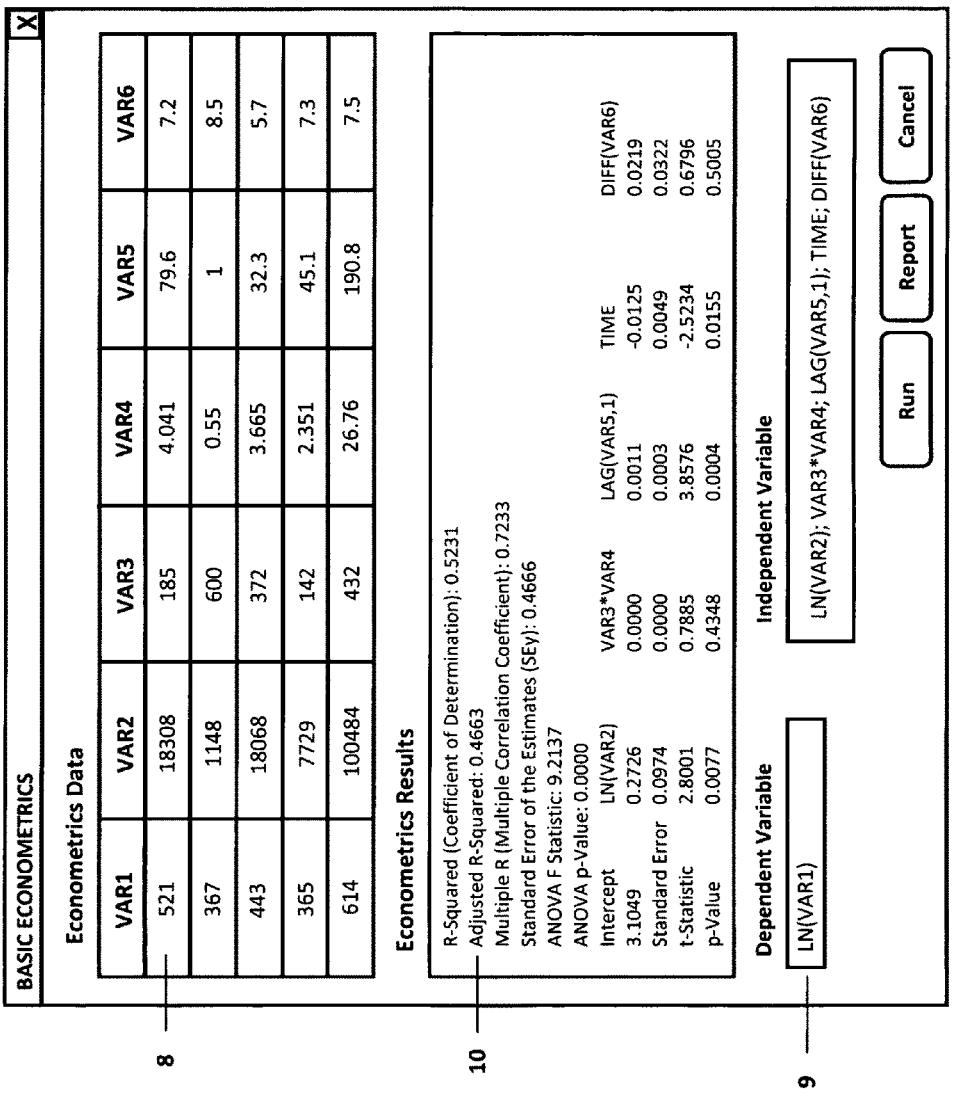
FIG. 06 illustrates the econometrics modeling capabilities in the system.

FIG. 06 illustrates the basic econometrics method in the software, where data is loaded directly into the tool 8 and customizable functions and equations can be entered 9 and a sample set of results 10 are available prior to running the entire report.

Figure 7:
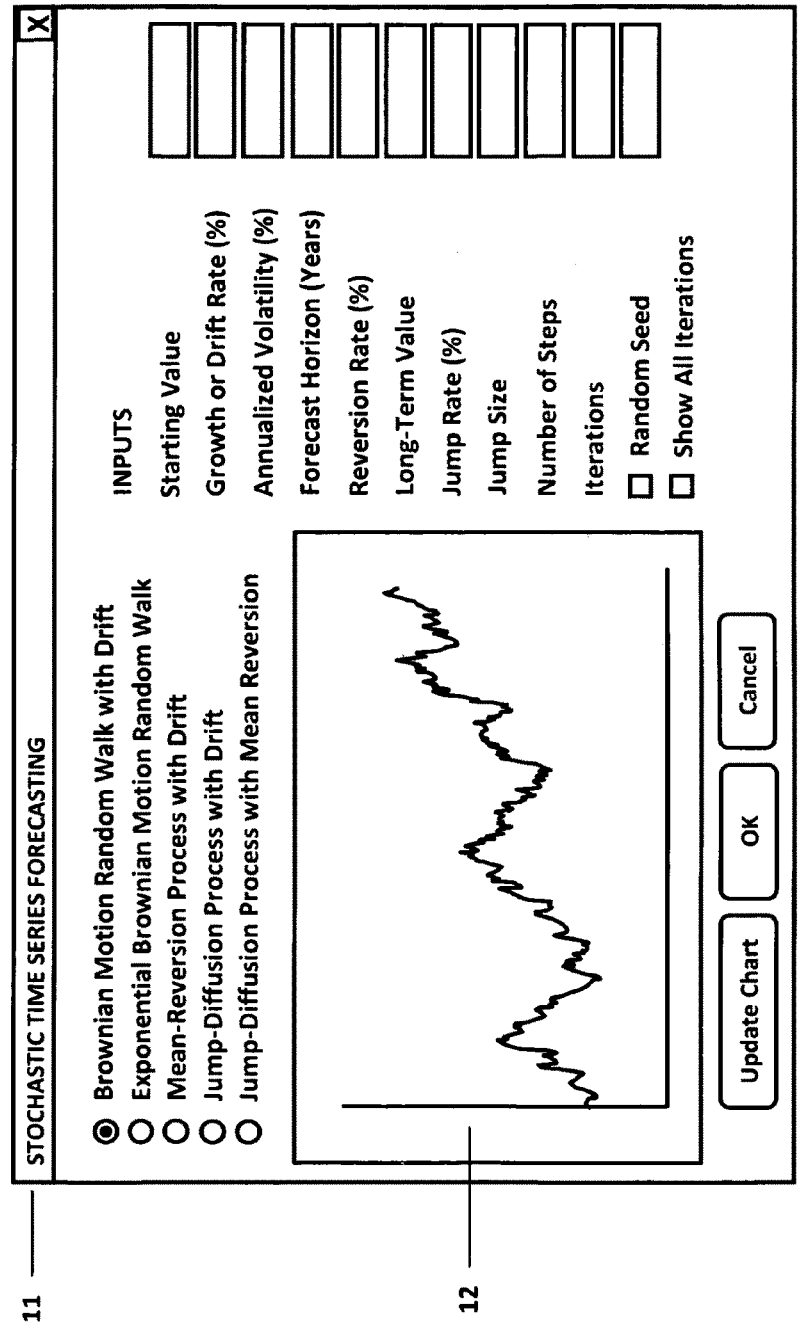
FIG. 07 illustrates the stochastic forecasting module and report.

FIG. 07 illustrates another sample report 11 and method called stochastic process forecasting 12, where multiple types of stochastic models are available to forecast future values (e.g., Brownian motion random walk for forecasting stock prices and commodity asset prices, mean-reversion for forecasting interest rates and inflation rates, jump-diffusion for modeling utility, oil and gas prices).

FIG. 08 illustrates a novel method called Auto-ARIMA 13 where different combinations of ARIMA (autoregressive integrated moving average) models (see the section on the mathematical details of this modeling approach) are automatically run and analyzed in this report, returning the rankings of the best to the worst forecasting models.

Figure 9:
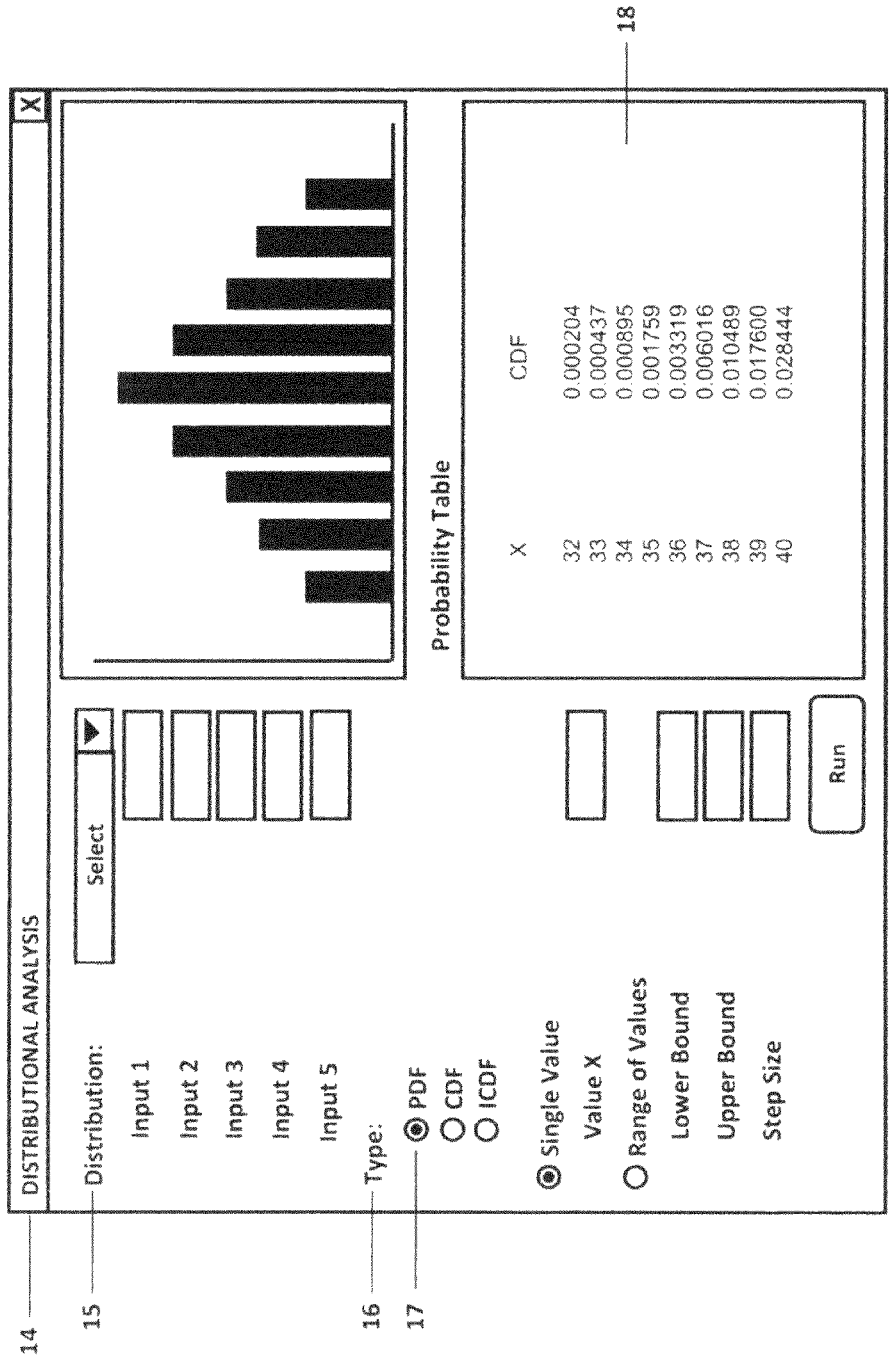
FIG. 09 illustrates the distribution analysis tool and associated probabilities.

FIG. 09 illustrates the distributional analysis tool 14 with 24 statistical distributions 15 where the probability density function (PDF), cumulative distribution function (CDF) and inverse cumulative distribution function (ICDF) 17 are available. The results show the distributional chart and probability tables 18.

Figure 10:
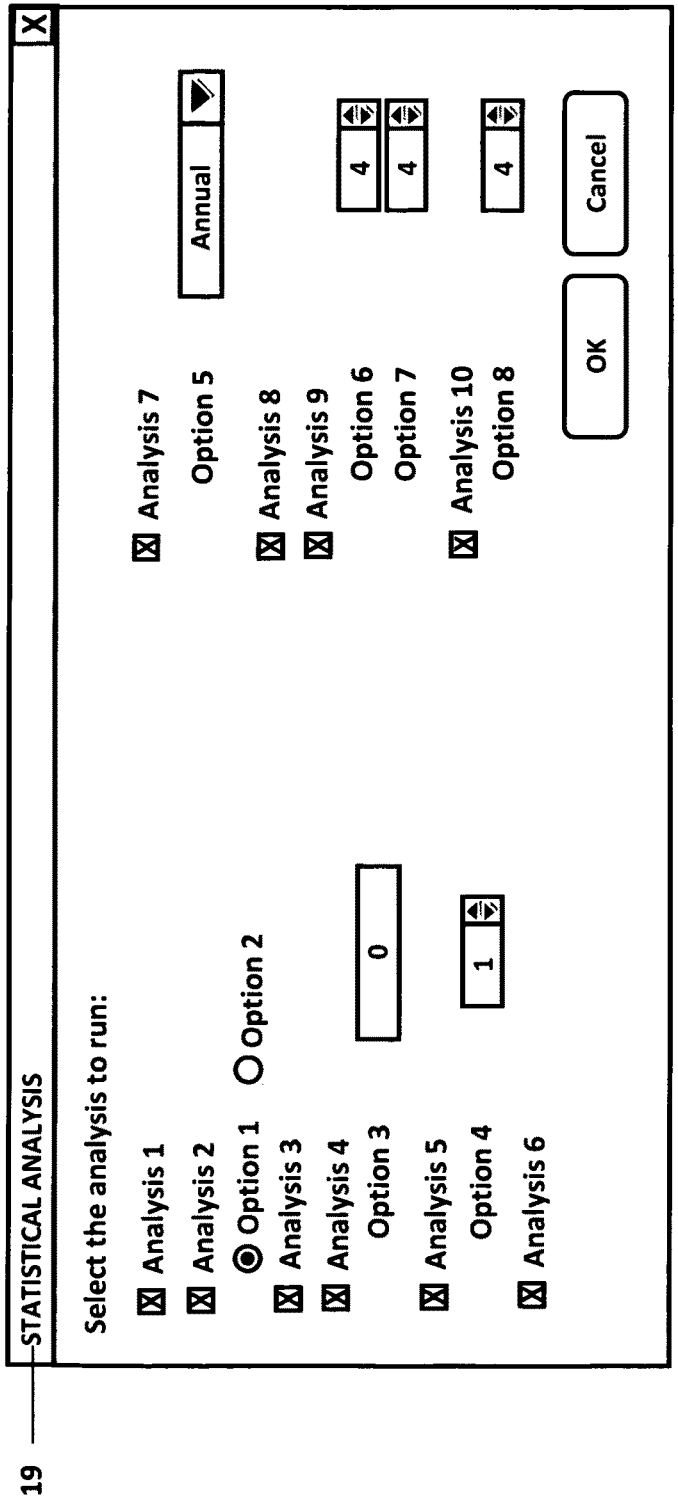
FIG. 10 illustrates the integrated statistical data analysis module.

FIG. 10 illustrates a comprehensive and integrated statistical analysis method where given some data, a set of comprehensive data analysis techniques are available 19 within a single mouse click.

Figure 11:
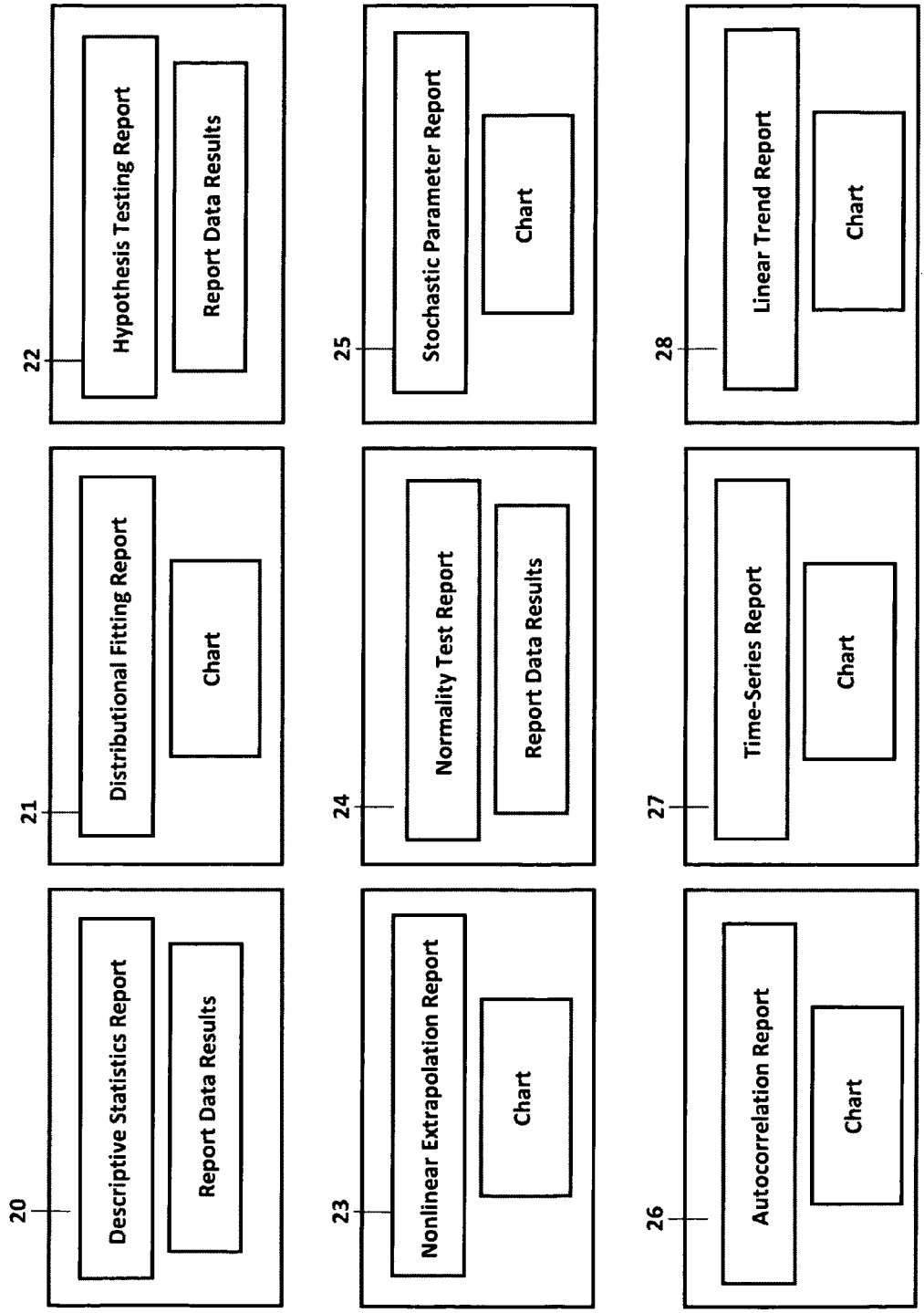
FIG. 11 illustrates the statistical data analysis report structure.

FIG. 11 illustrates the results generated using the statistical analysis tool method, where we obtain detailed descriptive statistics 20, distributional fitting 21, hypothesis testing results 22, nonlinear extrapolation 23, normality test 24, stochastic parameter estimations 25, autocorrelation 26, time-series autocorrelation 27, and linear trend 28.

FIG. 12 illustrates a comprehensive and integrated forecasting data diagnostic method where given some data, a set of comprehensive data analysis techniques are available 29 within a single mouse click.

Figure 13:
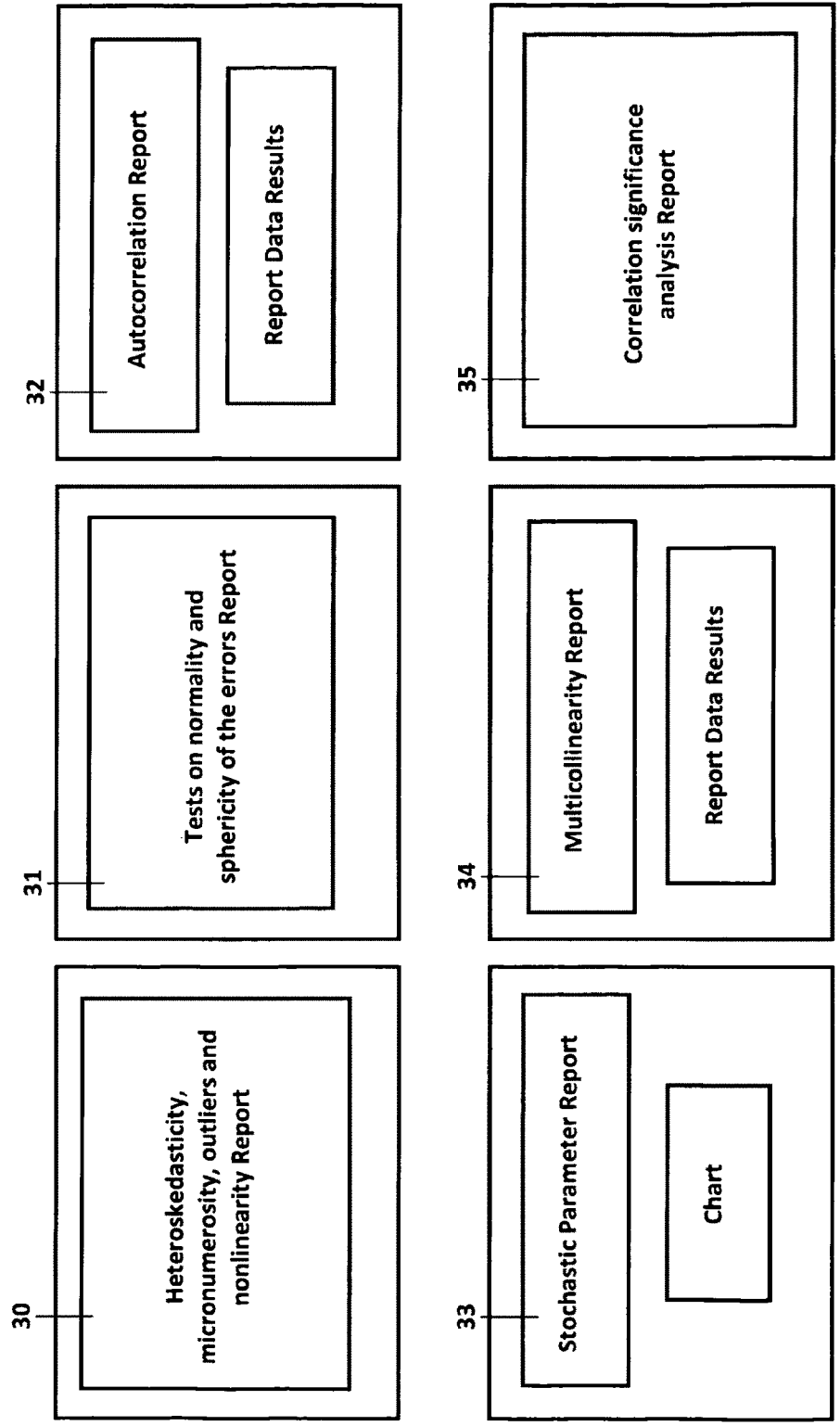
FIG. 13 illustrates the econometric and regression diagnostics reporting structure.

FIG. 13 illustrates the results of the data diagnostic tool, where the test for heteroskedasticity, micronumerosity, outliers and nonlinearity 30 are tested, followed by tests on normality and sphericity of the errors 31, autocorrelation 32, stochastic parameter estimations 33, multicollinearity 34, and correlation significance analysis 35.

Mathematical Probability Distributions

This section demonstrates the mathematical models and computations used in creating the Monte Carlo simulations. In order to get started with simulation, one first needs to understand the concept of probability distributions. To begin to understand probability, consider this example: You want to look at the distribution of nonexempt wages within one department of a large company. First, you gather raw data—in this case, the wages of each nonexempt employee in the department. Second, you organize the data into a meaningful format and plot the data as a frequency distribution on a chart. To create a frequency distribution, you divide the wages into group intervals and list these intervals on the chart's horizontal axis. Then you list the number or frequency of employees in each interval on the chart's vertical axis. Now you can easily see the distribution of nonexempt wages within the department. You can chart this data as a probability distribution. A probability distribution shows the number of employees in each interval as a fraction of the total number of employees. To create a probability distribution, you divide the number of employees in each interval by the total number of employees and list the results on the chart's vertical axis.

Probability distributions are either discrete or continuous. Discrete probability distributions describe distinct values, usually integers, with no intermediate values and are shown as a series of vertical bars. A discrete distribution, for example, might describe the number of heads in four flips of a coin as 0, 1, 2, 3, or 4. Continuous probability distributions are actually mathematical abstractions because they assume the existence of every possible intermediate value between two numbers; that is, a continuous distribution assumes there is an infinite number of values between any two points in the distribution. However, in many situations, you can effectively use a continuous distribution to approximate a discrete distribution even though the continuous model does not necessarily describe the situation exactly.

Probability Density Functions, Cumulative Distribution Functions, and Probability Mass Functions In mathematics and Monte Carlo simulation, a probability density function (PDF) represents a continuous probability distribution in terms of integrals. If a probability distribution has a density of $f(x)$, then intuitively the infinitesimal interval of $[x, x+dx]$ has a probability of $f(x) dx$. The PDF therefore can be seen as a smoothed version of a probability histogram; that is, by providing an empirically large sample of a continuous random variable repeatedly, the histogram using very narrow ranges will resemble the random variable's PDF. The probability of the interval between $[a, b]$ is given by $$\int_a^b f(x)dx,$$

which means that the total integral of the function $f$ must be 1.0. It is a common mistake to think of $f(a)$ as the probability of a. This is incorrect. In fact, $f(a)$ can sometimes be larger than 1—consider a uniform distribution between 0.0 and 0.5. The random variable x within this distribution will have $f(x)$ greater than 1. The probability in reality is the function $f(x)dx$ discussed previously, where dx is an infinitesimal amount.

The cumulative distribution function (CDF) is denoted as $F(x)=P(X \le x)$ indicating the probability of X taking on a less than or equal value to x. Every CDF is monotonically increasing, is continuous from the right, and at the limits, have the following properties:

$$\lim_{x \to -\infty} F(x) = 0 \text{ and } \lim_{x \to +\infty} F(x) = 1.$$

Further, the CDF is related to the PDF by $$F(b) - F(a) = P(a \le X \le b) = \int_a^b f(x)dx,$$

where the PDF function $f$ is the derivative of the CDF function F.

In probability theory, a probability mass function or PMF gives the probability that a discrete random variable is exactly equal to some value. The PMF differs from the PDF in that the values of the latter, defined only for continuous random variables, are not probabilities; rather, its integral over a set of possible values of the random variable is a probability. A random variable is discrete if its probability distribution is discrete and can be characterized by a PMF. Therefore, X is a discrete random variable if $$\sum_u P(X = u) = 1$$

as u runs through all possible values of the random variable X.

Discrete Distributions

Following is a detailed listing of the different types of probability distributions that can be used in Monte Carlo simulation.

Bernoulli or Yes/No Distribution

The Bernoulli distribution is a discrete distribution with two outcomes (e.g., head or tails, success or failure, 0 or 1). The Bernoulli distribution is the binomial distribution with one trial and can be used to simulate Yes/No or Success/Failure conditions. This distribution is the fundamental building block of other more complex distributions. For instance:

Binomial distribution: Bernoulli distribution with higher number of n total trials and computes the probability of x successes within this total number of trials.

Geometric distribution: Bernoulli distribution with higher number of trials and computes the number of failures required before the first success occurs.

Negative binomial distribution: Bernoulli distribution with higher number of trials and computes the number of failures before the xth success occurs.

The mathematical constructs for the Bernoulli distribution are as follows:

$$P(x) = \begin{cases} 1-p & \text{for } x = 0 \\ p & \text{for } x = 1 \end{cases}$$

or $$P(x) = p^x(1-p)^{1-x}$$

$$\text{mean} = p$$

$$\text{standard deviation} = \sqrt{p(1-p)}$$

$$\text{skewness} = \frac{1-2p}{\sqrt{p(1-p)}}$$

$$\text{excess kurtosis} = \frac{6p^2 - 6p + 1}{p(1-p)}$$

The probability of success (p) is the only distributional parameter. Also, it is important to note that there is only one trial in the Bernoulli distribution, and the resulting simulated value is either 0 or 1. The input requirements are such that Probability of Success>0 and <1 (that is, $0.0001 \leq p \leq 0.9999$).

Binomial Distribution

The binomial distribution describes the number of times a particular event occurs in a fixed number of trials, such as the number of heads in 10 flips of a coin or the number of defective items out of 50 items chosen.

The three conditions underlying the binomial distribution are:

For each trial, only two outcomes are possible that are mutually exclusive.

The trials are independent-what happens in the first trial does not affect the next trial.

The probability of an event occurring remains the same from trial to trial.

The mathematical constructs for the binomial distribution are as follows:

$$P(x) = \frac{n!}{x!(n-x)!} p^x (1-p)^{(n-x)}$$

for $n > 0$; $x = 0, 1, 2, \ldots n$; and $0 < p < 1$ $$\text{mean} = np$$

$$\text{standard deviation} = \sqrt{np(1-p)}$$

$$\text{skewness} = \frac{1-2p}{\sqrt{np(1-p)}}$$

$$\text{excess kurtosis} = \frac{6p^2 - 6p + 1}{np(1-p)}$$

The probability of success (p) and the integer number of total trials (n) are the distributional parameters. The number of successful trials is denoted x. It is important to note that probability of success (p) of 0 or 1 are trivial conditions and do not require any simulations, and hence, are not allowed in the software. The input requirements are such that Probability of Success>0 and <1 (that is, $0.0001 \leq p \leq 0.9999$), the Number of Trials>1 or positive integers and $\leq 1000$ (for larger trials, use the normal distribution with the relevant computed binomial mean and standard deviation as the normal distribution's parameters).

Discrete Uniform

The discrete uniform distribution is also known as the equally likely outcomes distribution, where the distribution has a set of N elements, and each element has the same probability. This distribution is related to the uniform distribution but its elements are discrete and not continuous. The mathematical constructs for the discrete uniform distribution are as follows:

$$P(x) = \frac{1}{N}$$

$$\text{mean} = \frac{N+1}{2} \text{ ranked value}$$

$$\text{standard deviation} = \sqrt{\frac{(N-1)(N+1)}{12}} \text{ ranked value}$$

skewness = 0 (that is, the distribution is perfectly symmetrical)

$$\text{excess kurtosis} = \frac{-6(N^2+1)}{5(N-1)(N+1)} \text{ ranked value}$$

The input requirements are such that Minimum<Maximum and both must be integers (negative integers and zero are allowed).

Geometric Distribution

The geometric distribution describes the number of trials until the first successful occurrence, such as the number of times you need to spin a roulette wheel before you win.

The three conditions underlying the geometric distribution are:
  The number of trials is not fixed.
  The trials continue until the first success.
  The probability of success is the same from trial to trial.
The mathematical constructs for the geometric distribution are as follows:

$$P(x) = p(1-p)^{x-1} \text{ for } 0 < p < 1 \text{ and } x = 1, 2, \ldots, n$$

$$\text{mean} = \frac{1}{p} - 1$$

$$\text{standard deviation} = \sqrt{\frac{1-p}{p^2}}$$

$$\text{skewness} = \frac{2-p}{\sqrt{1-p}}$$

$$\text{excess kurtosis} = \frac{p^2 - 6p + 6}{1-p}$$

The probability of success (p) is the only distributional parameter. The number of successful trials simulated is denoted x, which can only take on positive integers. The input requirements are such that Probability of success>0 and <1 (that is, $0.0001 \le p \le 0.9999$). It is important to note that probability of success (p) of 0 or 1 are trivial conditions and do not require any simulations, and hence, are not allowed in the software.

Hypergeometric Distribution

The hypergeometric distribution is similar to the binomial distribution in that both describe the number of times a particular event occurs in a fixed number of trials. The difference is that binomial distribution trials are independent, whereas hypergeometric distribution trials change the probability for each subsequent trial and are called trials without replacement. For example, suppose a box of manufactured parts is known to contain some defective parts. You choose a part from the box, find it is defective, and remove the part from the box. If you choose another part from the box, the probability that it is defective is somewhat lower than for the first part because you have removed a defective part. If you had replaced the defective part, the probabilities would have remained the same, and the process would have satisfied the conditions for a binomial distribution.

The three conditions underlying the hypergeometric distribution are:
  The total number of items or elements (the population size) is a fixed number, a finite population. The population size must be less than or equal to 1,750.
  The sample size (the number of trials) represents a portion of the population.
  The known initial probability of success in the population changes after each trial.

The mathematical constructs for the hypergeometric distribution are as follows:

$$P(x) = \frac{\frac{(N_x)!}{x!(N_x - x)!} \frac{(N - N_x)!}{(n - x)!(N - N_x - n + x)!}}{\frac{N!}{n!(N - n)!}}$$

for $x = \text{Max}(n - (N - N_x), 0), \ldots, \text{Min}(n, N_x)$ $$\text{mean} = \frac{N_x n}{N}$$

$$\text{standard deviation} = \sqrt{\frac{(N - N_x)N_x n(N - n)}{N^2(N - 1)}}$$

$$\text{skewness} = \frac{(N - 2N_x)(N - 2n)}{N - 2} \sqrt{\frac{N - 1}{(N - N_x)N_x n(N - n)}}$$

$$\text{excess kurtosis} = \frac{V(N, N_x, n)}{(N - N_x)N_x n(-3 + N)(-2 + N)(-N + n)} \text{ where}$$

$$V(N, N_x, n) = (N - N_x)^3 - (N - N_x)^5 + 3(N - N_x)^2 N_x - 6(N - N_x)^3 N_x +$$
$$(N - N_x)^4 N_x + 3(N - N_x)N_x^2 - 12(N - N_x)^2 N_x^2 + 8(N - N_x)^3 N_x^2 +$$
$$N_x^3 - 6(N - N_x)N_x^3 + 8(N - N_x)^2 N_x^3 + (N - N_x)N_x^4 - N_x^5 -$$
$$6(N - N_x)^3 N_x + 6(N - N_x)^4 N_x + 18(N - N_x)^2 N_x n - 6(N - N_x)^3 N_x n +$$
$$18(N - N_x)N_x^2 n - 24(N - N_x)^2 N_x^2 n - 6(N - N_x)^3 n - 6(N - N_x)N_x^3 n +$$
$$6N_x^4 n + 6(N - N_x)^2 n^2 - 6(N - N_x)^3 n^2 - 24(N - N_x)N_x n^2 +$$
$$12(N - N_x)^2 N_x n^2 + 6N_x^2 n^2 + 12(N - N_x)N_x^2 n^2 - 6N_x^3 n^2$$

The number of items in the population (N), trials sampled (n), and number of items in the population that have the successful trait ($N_x$) are the distributional parameters. The number of successful trials is denoted x. The input requirements are such that Population$\ge 2$ and integer,
Trials>0 and integer
Successes>0 and integer, Population>Successes
Trials<Population and Population<1750.

Negative Binomial Distribution

The negative binomial distribution is useful for modeling the distribution of the number of trials until the rth successful occurrence, such as the number of sales calls you need to make to close a total of 10 orders. It is essentially a superdistribution of the geometric distribution. This distribution shows the probabilities of each number of trials in excess of r to produce the required success r.

Conditions

The three conditions underlying the negative binomial distribution are:
  The number of trials is not fixed.
  The trials continue until the rth success.
  The probability of success is the same from trial to trial.

The mathematical constructs for the negative binomial distribution are as follows:

$$P(x) = \frac{(x + r - 1)!}{(r - 1)! x!} p^r (1 - p)^x$$

for $x = r, r + 1, \ldots$; and $0 < p < 1$ $$\text{mean} = \frac{r(1 - p)}{p}$$

$$\text{standard deviation} = \sqrt{\frac{r(1 - p)}{p^2}}$$

$$\text{skewness} = \frac{2 - p}{\sqrt{r(1 - p)}}$$

$$\text{excess kurtosis} = \frac{p^2 - 6p + 6}{r(1 - p)}$$

Probability of success (p) and required successes (r) are the distributional parameters. Where the input requirements are such that Successes required must be positive integers>0 and <8000, Probability of success>0 and <1 (that is, 0.0001≤p≤0.9999). It is important to note that probability of success (p) of 0 or 1 are trivial conditions and do not require any simulations, and hence, are not allowed in the software.

Poisson Distribution

The Poisson distribution describes the number of times an event occurs in a given interval, such as the number of telephone calls per minute or the number of errors per page in a document.

Conditions

The three conditions underlying the Poisson distribution are:

The number of possible occurrences in any interval is unlimited.

The occurrences are independent. The number of occurrences in one interval does not affect the number of occurrences in other intervals.

The average number of occurrences must remain the same from interval to interval.

The mathematical constructs for the Poisson are as follows:

$$P(x) = \frac{e^{-\lambda}\lambda^x}{x!} \text{ for } x \text{ and } \lambda > 0$$

$$\text{mean} = \lambda$$

$$\text{standard deviation} = \sqrt{\lambda}$$

$$\text{skewness} = \frac{1}{\sqrt{\lambda}}$$

$$\text{excess kurtosis} = \frac{1}{\lambda}$$

Rate ($\lambda$) is the only distributional parameter and the input requirements are such that Rate>0 and ≤1000 (that is, 0.0001≤rate≤1000).

Continuous Distributions

Beta Distribution

The beta distribution is very flexible and is commonly used to represent variability over a fixed range. One of the more important applications of the beta distribution is its use as a conjugate distribution for the parameter of a Bernoulli distribution. In this application, the beta distribution is used to represent the uncertainty in the probability of occurrence of an event. It is also used to describe empirical data and predict the random behavior of percentages and fractions, as the range of outcomes is typically between 0 and 1. The value of the beta distribution lies in the wide variety of shapes it can assume when you vary the two parameters, alpha and beta. If the parameters are equal, the distribution is symmetrical. If either parameter is 1 and the other parameter is greater than 1, the distribution is J-shaped. If alpha is less than beta, the distribution is said to be positively skewed (most of the values are near the minimum value). If alpha is greater than beta, the distribution is negatively skewed (most of the values are near the maximum value). The mathematical constructs for the beta distribution are as follows:

$$f(x) = \frac{(x)^{(\alpha-1)}(1-x)^{(\beta-1)}}{\left[\frac{\Gamma(\alpha)\Gamma(\beta)}{\Gamma(\alpha+\beta)}\right]} \text{ for } \alpha > 0; \beta > 0; x > 0$$

$$\text{mean} = \frac{\alpha}{\alpha+\beta}$$

$$\text{standard deviation} = \sqrt{\frac{\alpha\beta}{(\alpha+\beta)^2(1+\alpha+\beta)}}$$

$$\text{skewness} = \frac{2(\beta-\alpha)\sqrt{1+\alpha+\beta}}{(2+\alpha+\beta)\sqrt{\alpha\beta}}$$

$$\text{excess kurtosis} = \frac{3(\alpha+\beta+1)[\alpha\beta(\alpha+\beta-6)+2(\alpha+\beta)^2]}{\alpha\beta(\alpha+\beta+2)(\alpha+\beta+3)} - 3$$

Alpha ($\alpha$) and beta ($\beta$) are the two distributional shape parameters, and $\Gamma$ is the gamma function.

The two conditions underlying the beta distribution are:

The uncertain variable is a random value between 0 and a positive value.

The shape of the distribution can be specified using two positive values.

Input requirements:

Alpha and beta>0 and can be any positive value

Cauchy Distribution or Lorentzian Distribution or Breit-Wigner Distribution

The Cauchy distribution, also called the Lorentzian distribution or Breit-Wigner distribution, is a continuous distribution describing resonance behavior. It also describes the distribution of horizontal distances at which a line segment tilted at a random angle cuts the x-axis.

The mathematical constructs for the cauchy or Lorentzian distribution are as follows:

$$f(x) = \frac{1}{\pi}\frac{\gamma/2}{(x-m)^2 + \gamma^2/4}$$

The cauchy distribution is a special case where it does not have any theoretical moments (mean, standard deviation, skewness, and kurtosis) as they are all undefined. Mode location (m) and scale ($\gamma$) are the only two parameters in this distribution. The location parameter specifies the peak or mode of the distribution while the scale parameter specifies the half-width at half-maximum of the distribution. In addition, the mean and variance of a cauchy or Lorentzian distribution are undefined. In addition, the cauchy distribution is the Student's t distribution with only 1 degree of freedom. This distribution is also constructed by taking the ratio of two standard normal distributions (normal distributions with a mean of zero and a variance of one) that are independent of one another. The input requirements are such that Location can be any value whereas Scale>0 and can be any positive value.

Chi-Square Distribution

The chi-square distribution is a probability distribution used predominately in hypothesis testing, and is related to the gamma distribution and the standard normal distribution. For instance, the sums of independent normal distributions are distributed as a chi-square ($\chi^2$) with k degrees of freedom:

$$Z_1^2 + Z_2^2 + \ldots + Z_k^{2d} \sim \chi_k^2$$

The mathematical constructs for the chi-square distribution are as follows:

$$f(x) = \frac{2^{-k/2}}{\Gamma(k/2)}x^{k/2-1}e^{-x/2} \text{ for all } x > 0$$

$$\text{mean} = k$$

$$\text{standard deviation} = \sqrt{2k}$$

$$\text{skewness} = 2\sqrt{\frac{2}{k}}$$

$$\text{excess kurtosis} = \frac{12}{k}$$

$\Gamma$ is the gamma function. Degrees of freedom k is the only distributional parameter.

The chi-square distribution can also be modeled using a gamma distribution by setting the $$\text{shape parameter} = \frac{k}{2}$$

and scale=$2S^2$ where S is the scale. The input requirements are such that Degrees of freedom>1 and must be an integer<1000.

Exponential Distribution

The exponential distribution is widely used to describe events recurring at random points in time, such as the time between failures of electronic equipment or the time between arrivals at a service booth. It is related to the Poisson distribution, which describes the number of occurrences of an event in a given interval of time. An important characteristic of the exponential distribution is the "memoryless" property, which means that the future lifetime of a given object has the same distribution, regardless of the time it existed. In other words, time has no effect on future outcomes. The mathematical constructs for the exponential distribution are as follows:

$$f(x) = \lambda e^{-\lambda x} \text{ for } x \geq 0; \lambda > 0$$

$$\text{mean} = \frac{1}{\lambda}$$

$$\text{standard deviation} = \frac{1}{\lambda}$$

$$\text{skewness} = 2$$

(this value applies to all success rate $\lambda$ inputs)

$$\text{excess kurtosis} = 6$$

(this value applies to all success rate $\lambda$ inputs)

Success rate ($\lambda$) is the only distributional parameter. The number of successful trials is denoted x.

The condition underlying the exponential distribution is:

The exponential distribution describes the amount of time between occurrences.

Input requirements: Rate>0 and ≤300

Extreme Value Distribution or Gumbel Distribution

The extreme value distribution (Type 1) is commonly used to describe the largest value of a response over a period of time, for example, in flood flows, rainfall, and earthquakes. Other applications include the breaking strengths of materials, construction design, and aircraft loads and tolerances. The extreme value distribution is also known as the Gumbel distribution.

The mathematical constructs for the extreme value distribution are as follows:

$$f(x) = \frac{1}{\beta} z e^{-Z} \text{ where } z = e^{\frac{x-m}{\beta}}$$

for $\beta > 0$; and any value of $x$ and $m$ $$\text{mean} = m + 0.577215\beta$$

$$\text{standard deviation} = \sqrt{\frac{1}{6}\pi^2 \beta^2}$$

$$\text{skewness} = \frac{12\sqrt{6}(1.2020569)}{\pi^3} =$$

1.13955 (this applies for all values of mode and scale)

excess kurtosis = 5.4 (this applies for all values of mode and scale)

Mode (m) and scale ($\beta$) are the distributional parameters. There are two standard parameters for the extreme value distribution: mode and scale. The mode parameter is the most likely value for the variable (the highest point on the probability distribution). The scale parameter is a number greater than 0. The larger the scale parameter, the greater the variance. The input requirements are such that Mode can be any value and Scale>0.

F Distribution or Fisher-Snedecor Distribution

The F distribution, also known as the Fisher-Snedecor distribution, is another continuous distribution used most frequently for hypothesis testing. Specifically, it is used to test the statistical difference between two variances in analysis of variance tests and likelihood ratio tests. The F distribution with the numerator degree of freedom n and denominator degree of freedom m is related to the chi-square distribution in that:

$$\frac{\chi_n^2/n^d}{\chi_m^2/m} \sim F_{n,m}$$

$$\text{or } f(x) = \frac{\Gamma\left(\frac{n+m}{2}\right)\left(\frac{n}{m}\right)^{n/2} x^{n/2-1}}{\Gamma\left(\frac{n}{2}\right)\Gamma\left(\frac{m}{2}\right)\left[x\left(\frac{n}{m}\right)+1\right]^{(n+m)/2}}$$

$$\text{mean} = \frac{m}{m-2}$$

$$\text{standard deviation} = \frac{2m^2(m+n-2)}{n(m-2)^2(m-4)} \text{ for all } m > 4$$

$$\text{skewness} = \frac{2(m+2n-2)}{m-6}\sqrt{\frac{2(m-4)}{n(m+n-2)}}$$

$$\text{excess kurtosis} = \frac{12(-16+20m-8m^2+m^3+44n-32mn+5m^2n-22n^2+5mn^2)}{n(m-6)(m-8)(n+m-2)}$$

The numerator degree of freedom n and denominator degree of freedom m are the only distributional parameters. The input requirements are such that Degrees of freedom numerator and degrees of freedom denominator both>0 integers.

Gamma Distribution (Erlang Distribution)

The gamma distribution applies to a wide range of physical quantities and is related to other distributions: lognormal, exponential, Pascal, Erlang, Poisson, and Chi-Square. It is used in meteorological processes to represent pollutant concentrations and precipitation quantities. The gamma distribution is also used to measure the time between the occurrence of events when the event process is not completely random. Other applications of the gamma distribution include inventory control, economic theory, and insurance risk theory.

The gamma distribution is most often used as the distribution of the amount of time until the rth occurrence of an event in a Poisson process. When used in this fashion, the three conditions underlying the gamma distribution are:

The number of possible occurrences in any unit of measurement is not limited to a fixed number.

The occurrences are independent. The number of occurrences in one unit of measurement does not affect the number of occurrences in other units.

The average number of occurrences must remain the same from unit to unit.

The mathematical constructs for the gamma distribution are as follows:

$$f(x) = \frac{\left(\frac{x}{\beta}\right)^{\alpha-1} e^{-\frac{x}{\beta}}}{\Gamma(\alpha)\beta} \text{ with any value of } \alpha > 0 \text{ and } \beta > 0$$

$$\text{mean} = \alpha\beta$$

$$\text{standard deviation} = \sqrt{\alpha\beta^2}$$

$$\text{skewness} = \frac{2}{\sqrt{\alpha}}$$

$$\text{excess kurtosis} = \frac{6}{\alpha}$$

Shape parameter alpha ($\alpha$) and scale parameter beta ($\beta$) are the distributional parameters, and $\Gamma$ is the gamma function. When the alpha parameter is a positive integer, the gamma distribution is called the Erlang distribution, used to predict waiting times in queuing systems, where the Erlang distribution is the sum of independent and identically distributed random variables each having a memoryless exponential distribution. Setting n as the number of these random variables, the mathematical construct of the Erlang distribution is:

$$f(x) = \frac{x^{n-1} e^{-x}}{(n-1)!} \text{ for all } x > 0$$

and all positive integers of n, where the input requirements are such that Scale Beta>0 and can be any positive value, Shape Alpha≥0.05 and any positive value, and Location can be any value.

Logistic Distribution

The logistic distribution is commonly used to describe growth, that is, the size of a population expressed as a function of a time variable. It also can be used to describe chemical reactions and the course of growth for a population or individual.

The mathematical constructs for the logistic distribution are as follows:

$$f(x) = \frac{e^{\frac{\mu-x}{\alpha}}}{\alpha\left[1 + e^{\frac{\mu-x}{\alpha}}\right]^2} \text{ for any value of } \alpha \text{ and } \mu$$

$$\text{mean} = \mu$$

$$\text{standard deviation} = \sqrt{\frac{1}{3}\pi^2\alpha^2}$$

$$\text{skewness} = 0$$

(this applies to all mean and scale inputs)

$$\text{excess kurtosis} = 1.2$$

(this applies to all mean and scale inputs)

Mean ($\mu$) and scale ($\alpha$) are the distributional parameters. There are two standard parameters for the logistic distribution: mean and scale. The mean parameter is the average value, which for this distribution is the same as the mode, because this distribution is symmetrical. The scale parameter is a number greater than 0. The larger the scale parameter, the greater the variance.

Input requirements:
Scale>0 and can be any positive value
Mean can be any value

Lognormal Distribution

The lognormal distribution is widely used in situations where values are positively skewed, for example, in financial analysis for security valuation or in real estate for property valuation, and where values cannot fall below zero. Stock prices are usually positively skewed rather than normally (symmetrically) distributed. Stock prices exhibit this trend because they cannot fall below the lower limit of zero but might increase to any price without limit. Similarly, real estate prices illustrate positive skewness and are lognormally distributed as property values cannot become negative.

The three conditions underlying the lognormal distribution are:

The uncertain variable can increase without limits but cannot fall below zero.

The uncertain variable is positively skewed, with most of the values near the lower limit.

The natural logarithm of the uncertain variable yields a normal distribution.

Generally, if the coefficient of variability is greater than 30 percent, use a lognormal distribution. Otherwise, use the normal distribution.

The mathematical constructs for the lognormal distribution are as follows:

$$f(x) = \frac{1}{x\sqrt{2\pi}\ln(\sigma)} e^{-\frac{[\ln(x)-\ln(\mu)]^2}{2[\ln(\sigma)]^2}}$$

for $x > 0$; $\mu > 0$ and $\sigma > 0$ $$\text{mean} = \exp\left(\mu + \frac{\sigma^2}{2}\right)$$

$$\text{standard deviation} = \sqrt{\exp(\sigma^2 + 2\mu)[\exp(\sigma^2) - 1]}$$

$$\text{skewness} = \left[\sqrt{\exp(\sigma^2) - 1}\right](2 + \exp(\sigma^2))$$

$$\text{excess kurtosis} = \exp(4\sigma^2) + 2\exp(3\sigma^2) + 3\exp(2\sigma^2) - 6$$

Mean ($\mu$) and standard deviation ($\sigma$) are the distributional parameters. The input requirements are such that Mean and Standard deviation are both>0 and can be any positive value. By default, the lognormal distribution uses the arithmetic mean and standard deviation. For applications for which historical data are available, it is more appropriate to use either the logarithmic mean and standard deviation, or the geometric mean and standard deviation.

Normal Distribution

The normal distribution is the most important distribution in probability theory because it describes many natural phenomena, such as people's IQs or heights. Decision makers can use the normal distribution to describe uncertain variables such as the inflation rate or the future price of gasoline.

Conditions

The three conditions underlying the normal distribution are:
  Some value of the uncertain variable is the most likely (the mean of the distribution).
  The uncertain variable could as likely be above the mean as it could be below the mean (symmetrical about the mean).
  The uncertain variable is more likely to be in the vicinity of the mean than further away.

The mathematical constructs for the normal distribution are as follows:

$$f(x) = \frac{1}{\sqrt{2\pi}\,\sigma} e^{-\frac{(x-\mu)^2}{2\sigma^2}} \text{ for all values of } x \text{ and } \mu;$$

while $\sigma >$ mean $= \mu$ standard deviation $= \sigma$ skewness $= 0$ (this applies to all inputs of mean and standard deviation)

excess kurtosis $= 0$ (this applies to all inputs of mean and standard deviation)

Mean ($\mu$) and standard deviation ($\sigma$) are the distributional parameters. The input requirements are such that Standard deviation>0 and can be any positive value and Mean can be any value.

Pareto Distribution

The Pareto distribution is widely used for the investigation of distributions associated with such empirical phenomena as city population sizes, the occurrence of natural resources, the size of companies, personal incomes, stock price fluctuations, and error clustering in communication circuits.

The mathematical constructs for the pareto are as follows:

$$f(x) = \frac{\beta L^\beta}{x^{(1+\beta)}} \text{ for } x > L$$

$$\text{mean} = \frac{\beta L}{\beta - 1}$$

$$\text{standard deviation} = \sqrt{\frac{\beta L^2}{(\beta-1)^2(\beta-2)}}$$

$$\text{skewness} = \sqrt{\frac{\beta-2}{\beta}} \left[\frac{2(\beta+1)}{\beta-3}\right]$$

$$\text{excess kurtosis} = \frac{6(\beta^3 + \beta^2 - 6\beta - 2)}{\beta(\beta-3)(\beta-4)}$$

Location (L) and shape ($\beta$) are the distributional parameters.

There are two standard parameters for the Pareto distribution: location and shape. The location parameter is the lower bound for the variable. After you select the location parameter, you can estimate the shape parameter. The shape parameter is a number greater than 0, usually greater than 1. The larger the shape parameter, the smaller the variance and the thicker the right tail of the distribution. The input requirements are such that Location>0 and can be any positive value while Shape≥0.05.

Student's t Distribution

The Student's t distribution is the most widely used distribution in hypothesis test. This distribution is used to estimate the mean of a normally distributed population when the sample size is small, and is used to test the statistical significance of the difference between two sample means or confidence intervals for small sample sizes.

The mathematical constructs for the t-distribution are as follows:

$$f(t) = \frac{\Gamma[(r+1)/2]}{\sqrt{r\pi}\,\Gamma[r/2]}(1+t^2/r)^{-(r+1)/2}$$

mean $= 0$ (this applies to all degrees of freedom $r$ except if the distribution is shifted to another nonzero central location)

$$\text{standard deviation} = \sqrt{\frac{r}{r-2}}$$

skewness $= 0$ $$\text{excess kurtosis} = \frac{6}{r-4} \text{ for all} > 4$$

where $t = \dfrac{x - \bar{x}}{s}$ and $\Gamma$ is the gamma function.

Degree of freedom r is the only distributional parameter. The t-distribution is related to the F-distribution as follows: the square of a value of t with r degrees of freedom is distributed as F with 1 and r degrees of freedom. The overall shape of the probability density function of the t-distribution also resembles the bell shape of a normally distributed variable with mean 0 and variance 1, except that it is a bit lower and wider or is leptokurtic (fat tails at the ends and peaked center). As the number of degrees of freedom grows (say, above 30), the t-distribution approaches the normal distribution with mean 0 and variance 1. The input requirements are such that Degrees of freedom≥1 and must be an integer.

Triangular Distribution

The triangular distribution describes a situation where you know the minimum, maximum, and most likely values to occur. For example, you could describe the number of cars sold per week when past sales show the minimum, maximum, and usual number of cars sold.

Conditions

The three conditions underlying the triangular distribution are:
  The minimum number of items is fixed.
  The maximum number of items is fixed.
  The most likely number of items falls between the minimum and maximum values, forming a triangular-shaped distribution, which shows that values near the minimum and maximum are less likely to occur than those near the most-likely value.

The mathematical constructs for the triangular distribution are as follows:

$$f(x) = \begin{cases} \dfrac{2(x - \text{Min})}{(\text{Max} - \text{Min})(\text{Likely} - \text{min})} & \text{for Min} < x < \text{Likely} \\ \dfrac{2(\text{Max} - x)}{(\text{Max} - \text{Min})(\text{Max} - \text{Likely})} & \text{for Likely} < x < \text{Max} \end{cases}$$

$$\text{mean} = \frac{1}{3}(\text{Min} + \text{Likely} + \text{Max})$$

standard deviation =

$$\sqrt{\frac{1}{18}(\text{Min}^2 + \text{Likely}^2 + \text{Max}^2 - \text{MinMax} - \text{MinLikely} - \text{MaxLikely})}$$

skewness =

$$\frac{\sqrt{2}\,(\text{Min} + \text{Max} - 2\text{Likely})(2\text{Min} - \text{Max} - \text{Likely})(\text{Min} - 2\text{Max} + \text{Likely})}{5(\text{Min}^2 + \text{Max}^2 + \text{Likely}^2 - \text{MinMax} - \text{MinLikely} - \text{MaxLikely})^{3/2}}$$

excess kurtosis = −0.6

Minimum (Min), most likely (Likely) and maximum (Max) are the distributional parameters and the input requirements are such that Min≤Most Likely≤Max and can take any value, Min<Max and can take any value.

Uniform Distribution

With the uniform distribution, all values fall between the minimum and maximum and occur with equal likelihood.

The three conditions underlying the uniform distribution are:

The minimum value is fixed.
The maximum value is fixed.
All values between the minimum and maximum occur with equal likelihood.

The mathematical constructs for the uniform distribution are as follows:

$$f(x) = \frac{1}{\text{Max} - \text{Min}}$$

for all values such that Min < Max $$\text{mean} = \frac{\text{Min} + \text{Max}}{2}$$

$$\text{standard deviation} = \sqrt{\frac{(\text{Max} - \text{Min})^2}{12}}$$

skewness = 0 excess kurtosis = −1.2

(this applies to all inputs of Min and Max)

Maximum value (Max) and minimum value (Min) are the distributional parameters. The input requirements are such that Min<Max and can take any value.

Weibull Distribution (Rayleigh Distribution)

The Weibull distribution describes data resulting from life and fatigue tests. It is commonly used to describe failure time in reliability studies as well as the breaking strengths of materials in reliability and quality control tests. Weibull distributions are also used to represent various physical quantities, such as wind speed. The Weibull distribution is a family of distributions that can assume the properties of several other distributions. For example, depending on the shape parameter you define, the Weibull distribution can be used to model the exponential and Rayleigh distributions, among others. The Weibull distribution is very flexible. When the Weibull shape parameter is equal to 1.0, the Weibull distribution is identical to the exponential distribution. The Weibull location parameter lets you set up an exponential distribution to start at a location other than 0.0. When the shape parameter is less than 1.0, the Weibull distribution becomes a steeply declining curve. A manufacturer might find this effect useful in describing part failures during a burn-in period.

The mathematical constructs for the Weibull distribution are as follows:

$$f(x) = \frac{\alpha}{\beta}\left[\frac{x}{\beta}\right]^{\alpha-1} e^{-\left(\frac{x}{\beta}\right)^{\alpha}}$$

$$\text{mean} = \beta \Gamma(1 + \alpha^{-1})$$

$$\text{standard deviation} = \beta^2[\Gamma(1 + 2\alpha^{-1}) - \Gamma^2(1 + \alpha^{-1})]$$

$$\text{skewness} = \frac{2\Gamma^3(1 + \beta^{-1}) - 3\Gamma(1 + \beta^{-1})\Gamma(1 + 2\beta^{-1}) + \Gamma(1 + 3\beta^{-1})}{[\Gamma(1 + 2\beta^{-1}) - \Gamma^2(1 + \beta^{-1})]^{3/2}}$$

$$\text{excess kurtosis} = \frac{-6\Gamma^4(1 + \beta^{-1}) + 12\Gamma^2(1 + \beta^{-1})\Gamma(1 + 2\beta^{-1}) - 3\Gamma^2(1 + 2\beta^{-1}) - 4\Gamma(1 + \beta^{-1})\Gamma(1 + 3\beta^{-1}) + \Gamma(1 + 4\beta^{-1})}{[\Gamma(1 + 2\beta^{-1}) - \Gamma^2(1 + \beta^{-1})]^2}$$

Location (L), shape ($\alpha$) and scale ($\beta$) are the distributional parameters, and $\Gamma$ is the Gamma function. The input requirements are such that Scale>0 and can be any positive value, Shape≥0.05 and
Location can take on any value.

Multiple Regression Analysis and Econometric Data Analysis

This section demonstrates the mathematical models and computations used in creating the general regression equations, which take the form of $Y = \beta_0 + \beta_1 X_1 + \beta_2 X_2 + \ldots + \beta_n X_n + \epsilon$ where $\beta_0$ is the intercept, $\beta_i$ are the slope coefficients, and $\epsilon$ is the error term. The Y term is the dependent variable and the X terms are the independent variables, where these X variables are also known as the regressors. The dependent variable is named as such as it depends on the independent variable, for example, sales revenue depends on the amount of marketing costs expended on a product's advertising and promotion, making the dependent variable sales and the independent variable marketing costs. An example of a bivariate regression where there is only a single Y and a single X variable, is seen as simply inserting the best-fitting line through a set of data points in a two-dimensional plane. In other cases, a multivariate regression can be performed, where there are multiple or k number of independent X variables or regressors where in this case, the best-fitting line will be within a k+1 dimensional plane.

Fitting a line through a set of data points in a multidimensional scatter plot may result in numerous possible lines. The best-fitting line is defined as the single unique line that minimizes the total vertical errors, that is, the sum of the absolute distances between the actual data points ($Y_i$) and the estimated line ($\hat{Y}$). To find the best-fitting unique line that minimizes the errors, a more sophisticated approach is applied, using multivariate regression analysis. Regression analysis therefore finds the unique best-fitting line by requiring that the total errors be minimized, or by calculating $$\text{Min} \sum_{i=1}^{n} (Y_i - \hat{Y}_i)^2$$

Only one unique line will minimize this sum of squared errors as shown in the equation above. The errors (vertical distances between the actual data and the predicted line) are squared to avoid the negative errors from canceling out the positive errors. Solving this minimization problem with respect to the slope and intercept requires calculating first derivatives and setting them equal to zero:

$$\frac{d}{d\beta_0} \sum_{i=1}^{n} (Y_i - \hat{Y}_i)^2 = 0 \text{ and } \frac{d}{d\beta_1} \sum_{i=1}^{n} (Y_i - \hat{Y}_i)^2 = 0$$

Which yields the simple bivariate regression's set of least squares equations:

$$\beta_1 = \frac{\sum_{i=1}^{n} (X_i - \overline{X})(Y_i - \overline{Y})}{\sum_{i=1}^{n} (X_i - \overline{X})^2} = \frac{\sum_{i=1}^{n} X_i Y_i - \frac{\sum_{i=1}^{n} X_i \sum_{i=1}^{n} Y_i}{n}}{\sum_{i=1}^{n} X_i^2 - \frac{\left(\sum_{i=1}^{n} X_i\right)^2}{n}}$$

$$\beta_0 = \overline{Y} - \beta_1 \overline{X}$$

For multivariate regression, the analogy is expanded to account for multiple independent variables, where $Y_i = \beta_1 + \beta_2 X_{2,i} + \beta_3 X_{3,i} + \epsilon_i$ and the estimated slopes can be calculated by:

$$\hat{\beta}_2 = \frac{\sum Y_i X_{2,i} \sum X_{3,i}^2 - \sum Y_i X_{3,i} \sum X_{2,i} X_{3,i}}{\sum X_{2,i}^2 \sum X_{3,i}^2 - (\sum X_{2,i} X_{3,i})^2}$$

$$\hat{\beta}_3 = \frac{\sum Y_i X_{3,i} \sum X_{2,i}^2 - \sum Y_i X_{2,i} \sum X_{2,i} X_{3,i}}{\sum X_{2,i}^2 \sum X_{3,i}^2 - (\sum X_{2,i} X_{3,i})^2}$$

This set of results can be summarized using matrix notations: $[X'X]^{-1}[X'Y]$.

In running multivariate regressions, great care must be taken to set up and interpret the results. For instance, a good understanding of econometric modeling is required (e.g., identifying regression pitfalls such as structural breaks, multicollinearity, heteroskedasticity, autocorrelation, specification tests, nonlinearities, and so forth) before a proper model can be constructed. Therefore the present invention includes some advanced econometrics approaches that are based on the principles of multiple regression outlined above.

One approach used is that of an Auto-ARIMA, which is based on the fundamental concepts of ARIMA theory or Autoregressive Integrated Moving Average models. ARIMA (p,d,q) models are the extension of the AR model that uses three components for modeling the serial correlation in the time series data. The first component is the autoregressive (AR) term. The AR(p) model uses the p lags of the time series in the equation. An AR(p) model has the form: $y_t = a_1 y_{t-1} + \ldots + a_p y_{t-p} + e_t$. The second component is the integration (d) order term. Each integration order corresponds to differencing the time series. I(1) means differencing the data once. I (d) means differencing the data d times. The third component is the moving average (MA) term. The MA(q) model uses the q lags of the forecast errors to improve the forecast. An MA(q) model has the form: $y_t = e_t + b_1 e_{t-1} + \ldots + b_q e_{t-q}$. Finally, an ARMA(p,q) model has the combined form: $y_t = a_1 y_{t-1} + \ldots + a_p y_{t-p} + e_t + b_1 e_{t-1} + \ldots + b_q e_{t-q}$. Using this ARIMA concept, various combinations of p, d, q integers are tested in an automated and systematic fashion to determine the best-fitting model for the user's data.

In order to determine the best fitting model, we apply several goodness-of-fit statistics to provide a glimpse into the accuracy and reliability of the estimated regression model. They usually take the form of a t-statistic, F-statistic, R-squared statistic, adjusted R-squared statistic, Durbin-Watson statistic, Akaike Criterion, Schwarz Criterion, and their respective probabilities.

The R-squared ($R^2$), or coefficient of determination, is an error measurement that looks at the percent variation of the dependent variable that can be explained by the variation in the independent variable for a regression analysis. The coefficient of determination can be calculated by:

$$R^2 = 1 - \frac{\sum_{i=1}^{n} (Y_i - \hat{Y}_i)^2}{\sum_{i=1}^{n} (Y_i - \overline{Y})^2} = 1 - \frac{SSE}{TSS}$$

Where the coefficient of determination is one less the ratio of the sums of squares of the errors (SSE) to the total sums of squares (TSS). In other words, the ratio of SSE to TSS is the unexplained portion of the analysis, thus, one less the ratio of SSE to TSS is the explained portion of the regression analysis.

The estimated regression line is characterized by a series of predicted values ($\hat{Y}$); the average value of the dependent variable's data points is denoted $\overline{Y}$; and the individual data points are characterized by $Y_i$. Therefore, the total sum of squares, that is, the total variation in the data or the total variation about the average dependent value, is the total of the difference between the individual dependent values and its average (the total squared distance of $Y_i - \overline{Y}$). The explained sum of squares, the portion that is captured by the regression analysis, is the total of the difference between the regression's predicted value and the average dependent variable's data set (seen as the total squared distance of $\hat{Y} - \overline{Y}$). The difference between the total variation (TSS) and the explained variation (ESS) is the unexplained sums of squares, also known as the sums of squares of the errors (SSE).

Another related statistic, the adjusted coefficient of determination, or the adjusted R-squared ($\overline{R}^2$), corrects for the number of independent variables (k) in a multivariate regression through a degrees of freedom correction to provide a more conservative estimate:

$$\overline{R}^2 = 1 - \frac{\sum_{i=1}^{n} (Y_i - \hat{Y}_i)^2 / (k-2)}{\sum_{i=1}^{n} (Y_i - \overline{Y})^2 / (k-1)} = 1 - \frac{SSE/(k-2)}{TSS/(k-1)}$$

The adjusted R-squared should be used instead of the regular R-squared in multivariate regressions because every time an independent variable is added into the regression analysis, the R-squared will increase; indicating that the percent variation explained has increased. This increase occurs even when nonsensical regressors are added. The adjusted R-squared takes the added regressors into account and penalizes the regression accordingly, providing a much better estimate of a regression model's goodness-of-fit.

Other goodness-of-fit statistics include the t-statistic and the F-statistic. The former is used to test if each of the estimated slope and intercept(s) is statistically significant, that is, if it is statistically significantly different from zero (therefore making sure that the intercept and slope estimates are statistically valid). The latter applies the same concepts but simultaneously for the entire regression equation including the intercept and slopes. Using the previous example, the following illustrates how the t-statistic and F-statistic can be used in a regression analysis.

When running the Autoeconometrics methodology, multiple regression issues and errors are first tested for. These include items such as heteroskedasticity, multicollinearity, micronumerosity, lags, leads, autocorrelation and others. For instance, several tests exist to test for the presence of heteroskedasticity. These tests also are applicable for testing misspecifications and nonlinearities. The simplest approach is to graphically represent each independent variable against the dependent variable as illustrated earlier. Another approach is to apply one of the most widely used model, the White's test, where the test is based on the null hypothesis of no heteroskedasticity against an alternate hypothesis of heteroskedasticity of some unknown general form. The test statistic is computed by an auxiliary or secondary regression, where the squared residuals or errors from the first regression are regressed on all possible (and nonredundant) cross products of the regressors. For example, suppose the following regression is estimated:

$$Y = \beta_0 + \beta_1 X + \beta_2 Z + \epsilon_t$$

The test statistic is then based on the auxiliary regression of the errors ($\epsilon$):

$$\epsilon_t^2 = \alpha_0 + \alpha_1 X + \alpha_2 Z + \alpha_3 X^2 + \alpha_4 Z^2 + \alpha_5 XZ + v_t$$

The $nR^2$ statistic is the White's test statistic, computed as the number of observations (n) times the centered R-squared from the test regression. White's test statistic is asymptotically distributed as a $\chi^2$ with degrees of freedom equal to the number of independent variables (excluding the constant) in the test regression.

The White's test is also a general test for model misspecification, because the null hypothesis underlying the test assumes that the errors are both homoskedastic and independent of the regressors, and that the linear specification of the model is correct. Failure of any one of these conditions could lead to a significant test statistic. Conversely, a nonsignificant test statistic implies that none of the three conditions is violated. For instance, the resulting F-statistic is an omitted variable test for the joint significance of all cross products, excluding the constant.

One method to fix heteroskedasticity is to make it homoskedastic by using a weighted least squares (WLS) approach. For instance, suppose the following is the original regression equation:

$$Y = \beta_0 + \beta_1 X_1 + \beta_2 X_2 + \beta_3 X_3 + \epsilon$$

Further suppose that $X_2$ is heteroskedastic. Then transform the data used in the regression into:

$$Y = \frac{\beta_0}{X_2} + \beta_1 \frac{X_1}{X_2} + \beta_2 + \beta_3 \frac{X_3}{X_2} + \frac{\epsilon}{X_2}$$

The model can be redefined as the following WLS regression:

$$Y_{WLS} = \beta_0^{WLS} + \beta_1^{WLS} X_1 + \beta_2^{WLS} X_2 + \beta_3^{WLS} X_3 + v$$

Alternatively, the Park's test can be applied to test for heteroskedasticity and to fix it. The Park's test model is based on the original regression equation, uses its errors, and creates an auxiliary regression that takes the form of:

$$\ln e_i^2 = \beta_1 + \beta_2 \ln X_{k,i}$$

Suppose $\beta_2$ is found to be statistically significant based on a t-test, then heteroskedasticity is found to be present in the variable $X_{k,i}$. The remedy therefore is to use the following regression specification:

$$\frac{Y}{\sqrt{X_k^{\beta_2}}} = \frac{\beta_1}{\sqrt{X_k^{\beta_2}}} + \frac{\beta_2 X_2}{\sqrt{X_k^{\beta_2}}} + \frac{\beta_3 X_3}{\sqrt{X_k^{\beta_2}}} + \epsilon.$$

Multicollinearity exists when there is a linear relationship between the independent variables. When this occurs, the regression equation cannot be estimated at all. In near collinearity situations, the estimated regression equation will be biased and provide inaccurate results. This situation is especially true when a step-wise regression approach is used, where the statistically significant independent variables will be thrown out of the regression mix earlier than expected, resulting in a regression equation that is neither efficient nor accurate.

As an example, suppose the following multiple regression analysis exists, where $$Y_i = \beta_1 + \beta_2 X_{2,i} + \beta_3 X_{3,i} + \epsilon_i$$

The estimated slopes can be calculated through $$\hat{\beta}_2 = \frac{\sum Y_i X_{2,i} \sum X_{3,i}^2 - \sum Y_i X_{3,i} \sum X_{2,i} X_{3,i}}{\sum X_{2,i}^2 \sum X_{3,i}^2 - (\sum X_{2,i} X_{3,i})^2}$$

$$\hat{\beta}_3 = \frac{\sum Y_i X_{3,i} \sum X_{2,i}^2 - \sum Y_i X_{2,i} \sum X_{2,i} X_{3,i}}{\sum X_{2,i}^2 \sum X_{3,i}^2 - (\sum X_{2,i} X_{3,i})^2}$$

Now suppose that there is perfect multicollinearity, that is, there exists a perfect linear relationship between $X_2$ and $X_3$, such that $X_{3,i} = \lambda X_{2,i}$ for all positive values of $\lambda$. Substituting this linear relationship into the slope calculations for $\beta_2$, the result is indeterminate. In other words, we have $$\hat{\beta}_2 = \frac{\sum Y_i X_{2,i} \sum \lambda^2 X_{2,i}^2 - \sum Y_i \lambda X_{2,i} \sum \lambda X_{2,i}^2}{\sum X_{2,i}^2 \sum \lambda^2 X_{2,i}^2 - (\sum \lambda X_{2,i}^2)^2} = \frac{0}{0}$$

The same calculation and results apply to $\beta_3$, which means that the multiple regression analysis breaks down and cannot be estimated given a perfect collinearity condition.

One quick test of the presence of multicollinearity in a multiple regression equation is that the R-squared value is relatively high while the t-statistics are relatively low. Another quick test is to create a correlation matrix between the independent variables. A high cross correlation indicates a potential for multicollinearity. The rule of thumb is that a correlation with an absolute value greater than 0.75 is indicative of severe multicollinearity.

Another test for multicollinearity is the use of the variance inflation factor (VIF), obtained by regressing each independent variable to all the other independent variables, obtaining the R-squared value and calculating the VIF of that variable by estimating:

$$VIF_i = \frac{1}{(1-R_i^2)}$$

A high VIF value indicates a high R-squared near unity. As a rule of thumb, a VIF value greater than 10 is usually indicative of destructive multicollinearity. The Autoeconometrics method computes for multicollinearity and corrects the data before running the next iteration when enumerating through the entire set of possible combinations and permutations of models.

One very simple approach to test for autocorrelation is to graph the time series of a regression equation's residuals. If these residuals exhibit some cyclicality, then autocorrelation exists. Another more robust approach to detect autocorrelation is the use of the Durbin-Watson statistic, which estimates the potential for a first-order autocorrelation. The Durbin-Watson test also identifies model misspecification. That is, if a particular time-series variable is correlated to itself one period prior. Many time-series data tend to be autocorrelated to their historical occurrences. This relationship can be due to multiple reasons, including the variables' spatial relationships (similar time and space), prolonged economic shocks and events, psychological inertia, smoothing, seasonal adjustments of the data, and so forth.

The Durbin-Watson statistic is estimated by the sum of the squares of the regression errors for one period prior, to the sum of the current period's errors:

$$DW = \frac{\sum (\varepsilon_t - \varepsilon_{t-1})^2}{\sum \varepsilon_t^2}$$

There is a Durbin-Watson critical statistic table at the end of the book that provides a guide as to whether a statistic implies any autocorrelation.

Another test for autocorrelation is the Breusch-Godfrey test, where for a regression function in the form of:

$$Y=f(X_1,X_2,\ldots,X_k)$$

Estimate this regression equation and obtain its errors $\varepsilon_t$. Then, run the secondary regression function in the form of:

$$Y=f(X_1,X_2,\ldots,X_k,\varepsilon_{t-1},\varepsilon_{t-2},\varepsilon_{t-p})$$

Obtain the R-squared value and test it against a null hypothesis of no autocorrelation versus an alternate hypothesis of autocorrelation, where the test statistic follows a Chi-Square distribution of p degrees of freedom:

$$R^2(n-p) \sim \Omega_{df=p}^2$$

Fixing autocorrelation requires the application of advanced econometric models including the applications of ARIMA (as described above) or ECM (Error Correction Models). However, one simple fix is to take the lags of the dependent variable for the appropriate periods, add them into the regression function, and test for their significance, for instance:

$$Y_t=f(Y_{t-1},Y_{t-2},\ldots,Y_{t-p},X_1,X_2,\ldots,X_k)$$

In interpreting the results of an Autoeconometrics model, most of the specifications are identical to the multivariate regression analysis. However, there are several additional sets of results specific to the econometric analysis. The first is the addition of Akaike Information Criterion (AIC) and Schwarz Criterion (SC), which are often used in ARIMA model selection and identification. That is, AIC and SC are used to determine if a particular model with a specific set of p, d, and q parameters is a good statistical fit. SC imposes a greater penalty for additional coefficients than the AIC but generally, the model with the lowest AIC and SC values should be chosen. Finally, an additional set of results called the autocorrelation (AC) and partial autocorrelation (PAC) statistics are provided in the ARIMA report.

For instance, if autocorrelation AC(1) is nonzero, it means that the series is first order serially correlated. If AC dies off more or less geometrically with increasing lags, it implies that the series follows a low-order autoregressive process. If AC drops to zero after a small number of lags, it implies that the series follows a low-order moving-average process. In contrast, PAC measures the correlation of values that are k periods apart after removing the correlation from the intervening lags. If the pattern of autocorrelation can be captured by an autoregression of order less than k, then the partial autocorrelation at lag k will be close to zero. The Ljung-Box Q-statistics and their p-values at lag k are also provided, where the null hypothesis being tested is such that there is no autocorrelation up to order k. The dotted lines in the plots of the autocorrelations are the approximate two standard error bounds. If the autocorrelation is within these bounds, it is not significantly different from zero at approximately the 5% significance level. Finding the right ARIMA model takes practice and experience. These AC, PAC, SC, and AIC are highly useful diagnostic tools to help identify the correct model specification. Finally, the ARIMA parameter results are obtained using sophisticated optimization and iterative algorithms, which means that although the functional forms look like those of a multivariate regression, they are not the same. ARIMA is a much more computationally intensive and advanced econometric approach.

I claim:

1. A non-transitory computer-readable medium that stores computer-executable instructions that are executable by a computer processor, the instructions when executed embodying a method that comprises:
    using a computer processor in a computing device comprising an operating system, hard drive, motherboard, and Ethernet card to store, in a non-transitory computer-readable medium, a plurality of forecasting models and methods to automatically analyze business risk, related to a company, through an intelligent set of statistical and analytical tests;
    using an automatic autoregressive integrated moving average (ARIMA) model to rank said forecasting models from best to worst based on user provided data, so that a user can make an informed decision as to which model to use for a particular set of data, wherein said ranking of models comprises the steps of:
    testing said forecasting models for heteroskedastic data by applying White's test;

altering any said heteroskedastic data into homoskedastic data by applying a Weighted Least Squares (WLS) approach;

testing said forecasting models for multicollinearity by creating a correlation matrix between the independent variables of said user-provided data, wherein a cross correlation, in said correlation matrix, of greater than 0.75 indicates undesirable multicollinearity, and correcting any said undesirable multicollinearity;

testing said forecasting models for autocorrelation using a Durbin-Watson statistic;

fixing any found autocorrelation in said forecasting models by adding time lags of said found autocorrelation into a regression function and testing for the significance of said time lags;

testing said forecasting models for model misspecification by using White's test and a Durbin-Watson statistic;

determining a best fit model for said user-provided data by testing various combinations of p, d, q integers in said ARIMA model in an automated and systematic fashion and applying a plurality of goodness-of-fit statistics to said ARIMA model, wherein said plurality of goodness-of-fit statistics consists of a t-statistic, an F-statistic, an R-squared statistic, and an adjusted R-squared statistic;

representing graphically one or more independent variables contained in said best fit model against one or more dependent variables contained in said best fit model;

using Akaike information criterion on one or more of said various combinations of p, d, q integers in said ARIMA model to determine a Akaike information criterion value;

using Schwarz criterion on one or more of said various combinations of p, d, q integers in said ARIMA model to determine a Schwarz criterion value;

selecting, as the best fit model, the ARIMA model with the lowest Akaike information criterion and said Schwarz criterion values;

calculating a set of autocorrelation statistics from said best fit model;

calculating a set of partial autocorrelation statistics from said best fit model;

creating a result from at least said best fit model, said set of autocorrelation statistics and said set of partial autocorrelation statistics; and utilizing said results to determine a ranking of said forecasting models.

2. A computer implemented method for automatically analyzing business risk through an intelligent set of statistical and analytical tests, said method comprising:

using a computer processor in a computing device comprising an operating system, hard drive, motherboard, and Ethernet card to store, in a non-transitory computer-readable medium, a plurality of methods to automatically analyze business risk, related to a company, through an intelligent set of statistical and analytical tests;

using an automatic autoregressive integrated moving average (ARIMA) model to rank statistical forecasting models from best to worst, so that a user can make an informed decision as to which model to use, wherein said ranking of models comprises the steps of:

testing said forecasting models for heteroskedastic data by applying White's test;

altering any said heteroskedastic data into homoskedastic data by applying a Weighted Least Squares (WLS) approach;

testing said forecasting models for multicollinearity by creating a correlation matrix between the independent variables of said user-provided data, wherein a cross correlation, in said correlation matrix, of greater than 0.75 indicates undesirable multicollinearity, and correcting any said undesirable multicollinearity;

testing said forecasting models for autocorrelation using a Durbin-Watson statistic;

fixing any found autocorrelation in said forecasting models by adding time lags of said found autocorrelation into a regression function and testing for the significance of said time lags;

testing said forecasting models for model misspecification by using White's test and using a Durbin-Watson statistic;

determining a best fit model for said user-provided data by testing various combinations of p, d, q integers in said ARIMA model in an automated and systematic fashion and applying a plurality of goodness-of-fit statistics to said ARIMA, wherein said plurality of goodness-of-fit statistics consists of a t-statistic, an F-statistic, an R-squared statistic, and an adjusted R-squared statistic;

representing graphically one or more independent variables contained in said best fit model against one or more dependent variables contained in said best fit model;

using Akaike information criterion on one or more of said various combinations of p, d, q integers in said ARIMA model to determine a Akaike information criterion value;

using Schwarz criterion on one or more of said various combinations of p, d, q integers in said ARIMA model to determine a Schwarz criterion value;

selecting, as the best fit model, the ARIMA model with the lowest Akaike information criterion and said Schwarz criterion values;

calculating a set of autocorrelation statistics from said best fit model;

calculating a set of partial autocorrelation statistics from said best fit model;

creating a result from at least said best fit model, said set of autocorrelation statistics and said set of partial autocorrelation statistics; and utilizing said results to determine a ranking of said forecasting models.

\* \* \* \* \*